(12) United States Patent
Cho et al.

(10) Patent No.: US 11,342,328 B2
(45) Date of Patent: May 24, 2022

(54) SEMICONDUCTOR DEVICE

(71) Applicant: Samsung Electronics Co., Ltd., Suwon-si (KR)

(72) Inventors: Guyoung Cho, Seoul (KR); Subin Shin, Suwon-si (KR); Donghyun Roh, Suwon-si (KR); Byung-Suk Jung, Seoul (KR); Sangjin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 116 days.

(21) Appl. No.: 16/943,208

(22) Filed: Jul. 30, 2020

(65) Prior Publication Data

US 2020/0357800 A1 Nov. 12, 2020

Related U.S. Application Data

(63) Continuation of application No. 16/273,572, filed on Feb. 12, 2019, now Pat. No. 10,784,262.

(30) Foreign Application Priority Data

Jun. 29, 2018 (KR) .................. 10-2018-0076069

(51) Int. Cl.
| | | |
|---|---|---|
| *H01L 27/092* | (2006.01) | |
| *H01L 21/8238* | (2006.01) | |
| *H01L 29/06* | (2006.01) | |
| *H01L 29/78* | (2006.01) | |

(52) U.S. Cl.
CPC .. *H01L 27/0924* (2013.01); *H01L 21/823821* (2013.01); *H01L 29/0649* (2013.01); *H01L 29/7851* (2013.01)

(58) Field of Classification Search
CPC ............ H01L 27/0924; H01L 29/7851; H01L 29/0649; H01L 21/823821
See application file for complete search history.

(56) References Cited

U.S. PATENT DOCUMENTS

| | | |
|---|---|---|
| 8,697,536 B1 | 4/2014 | Cheng et al. |
| 9,082,851 B2 | 7/2015 | Ramachandran et al. |
| 9,559,191 B2 | 1/2017 | Basker et al. |
| 9,704,752 B1 | 7/2017 | Chang et al. |
| 9,734,060 B2 | 8/2017 | Dong et al. |
| 9,871,041 B1 | 1/2018 | Cheng et al. |

(Continued)

FOREIGN PATENT DOCUMENTS

| | | |
|---|---|---|
| KR | 10-1096522 B1 | 12/2011 |
| KR | 10-2016-0073851 A | 6/2016 |

*Primary Examiner* — Karen Kusumakar
*Assistant Examiner* — Adam S Bowen
(74) *Attorney, Agent, or Firm* — Muir Patent Law, PLLC

(57) ABSTRACT

Disclosed is a semiconductor device comprising a substrate, a plurality of active patterns that protrude from the substrate, a device isolation layer between the active patterns, and a passivation layer that covers a top surface of the device isolation layer and exposes upper portions of the active patterns. The device isolation layer includes a plurality of first isolation parts adjacent to facing sidewalls of the active patterns, and a second isolation part between the first isolation parts. A top surface of the second isolation part is located at a lower level than that of top surfaces of the first isolation parts.

20 Claims, 24 Drawing Sheets

(56) References Cited

U.S. PATENT DOCUMENTS

| | | | |
|---|---|---|---|
| 2006/0186485 A1* | 8/2006 | Cho | H01L 27/11529 |
| | | | 257/401 |
| 2010/0207209 A1 | 8/2010 | Inokuma | |
| 2011/0223731 A1 | 9/2011 | Chung et al. | |
| 2015/0102413 A1* | 4/2015 | Azmat | H01L 27/11807 |
| | | | 257/365 |
| 2015/0132909 A1* | 5/2015 | Choi | H01L 21/2236 |
| | | | 438/283 |
| 2016/0086947 A1* | 3/2016 | Park | H01L 27/0207 |
| | | | 257/369 |
| 2016/0254180 A1 | 9/2016 | Liu et al. | |
| 2016/0268414 A1* | 9/2016 | Park | H01L 27/0886 |
| 2017/0062403 A1* | 3/2017 | Song | G06F 30/398 |
| 2017/0117411 A1* | 4/2017 | Kim | H01L 29/66636 |

\* cited by examiner

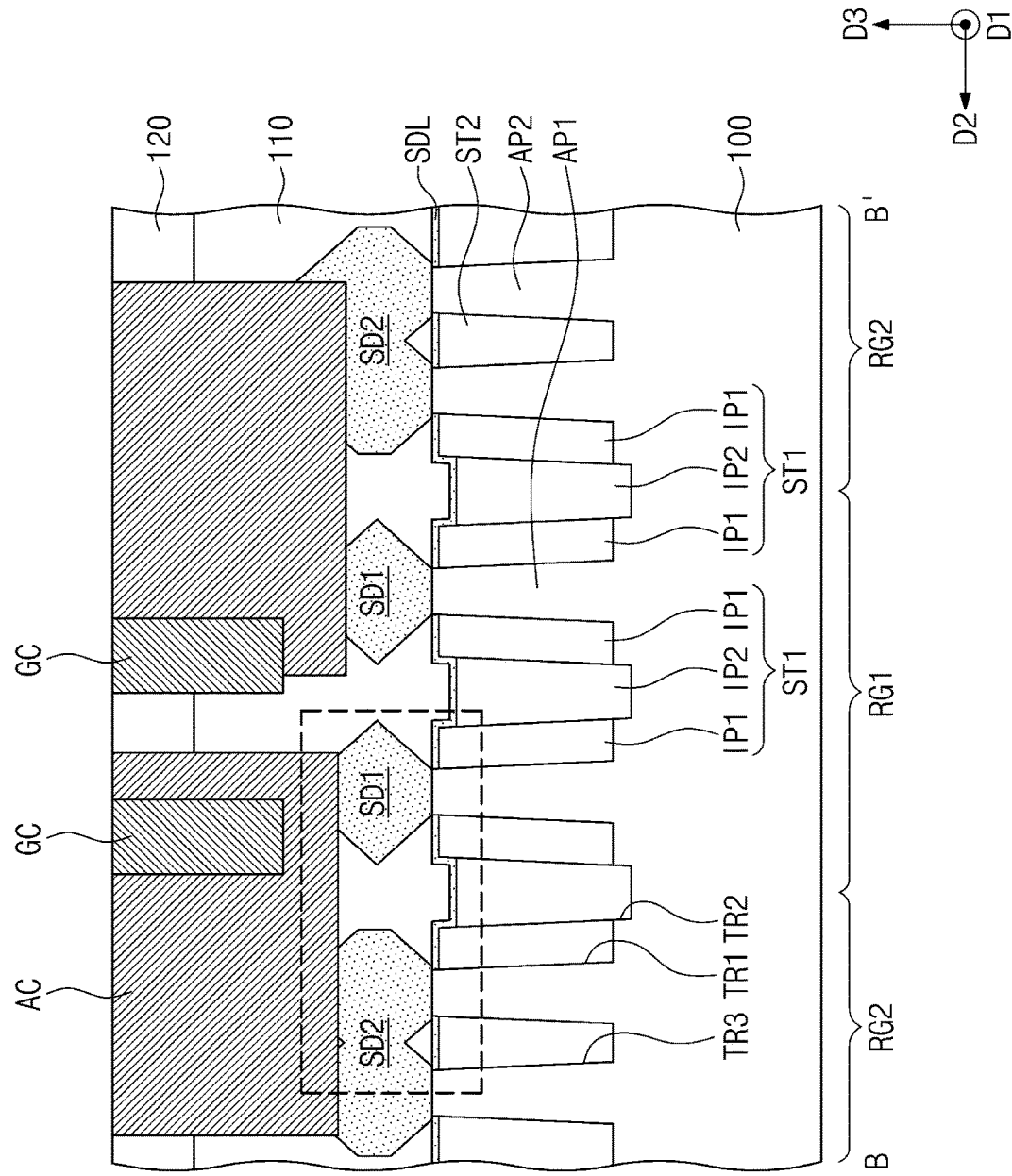

SEMICONDUCTOR DEVICE

CROSS-REFERENCE TO RELATED APPLICATION

This U.S. nonprovisional application is a continuation of U.S. patent application Ser. No. 16/273,572, filed Feb. 12, 2019, in the U.S. Patent and Trademark Office, which claims the benefit of priority under 35 U.S.C. § 119 to Korean Patent Application No. 10-2018-0076069, filed Jun. 29, 2018, in the Korean Intellectual Property Office, the entire contents of both of which are hereby incorporated by reference.

BACKGROUND

The present disclosure relates to a semiconductor device and a method of manufacturing the same, and more particularly, to a semiconductor device including a field effect transistor and a method of manufacturing the same.

A semiconductor device includes an integrated circuit consisting of metal oxide semiconductor field effect transistors (MOSFETs). As the semiconductor device becomes highly integrated, the scale-down of the MOSFETs is also being accelerated, and thus operating characteristics of the semiconductor device may deteriorate. Research has therefore been performed to fabricate a semiconductor device having high-quality performance while overcoming limitations due to high integration of the semiconductor device.

SUMMARY

Some example embodiments of the present concepts provide a semiconductor device including a field effect transistor with enhanced electrical characteristics.

According to some example embodiments, the disclosure is directed to a semiconductor device, comprising: a substrate; a plurality of active patterns that protrude with respect to the substrate; a device isolation layer between the active patterns; and a passivation layer that covers a top surface of the device isolation layer and exposes upper portions of the active patterns, wherein the device isolation layer includes: a plurality of first isolation parts adjacent to facing sidewalls of the active patterns; and a second isolation part between the first isolation parts, wherein a top surface of the second isolation part is located at a lower vertical level than top surfaces of the first isolation parts.

According to some example embodiments, the disclosure is directed to a semiconductor device, comprising: a substrate that includes a plurality of active patterns extending lengthwise in a first direction; a gate electrode that runs across the active pattern and extends lengthwise in a second direction; a device isolation layer that fills a gap between the active patterns; a passivation layer that covers a top surface of the device isolation layer and exposes upper portions of the active patterns; and a gate dielectric layer between the gate electrode and the active patterns and between the gate electrode and the passivation layer, wherein the passivation layer includes a plurality of first segments and a second segment between two first segments of the plurality of first segments, wherein a top surface of the second segment is located at a lower vertical level than top surfaces of each of the two first segments.

According to some example embodiments, the disclosure is directed to a semiconductor device, comprising: a substrate that includes a first active pattern and a second active pattern; a device isolation layer that fills a gap between the first and second active patterns; a passivation layer that is disposed on the device isolation layer and exposes an upper portion of the first active pattern and an upper portion of the second active pattern; a first source/drain pattern at the upper portion of the first active pattern; and a second source/drain pattern at the upper portion of the second active pattern, wherein the passivation layer includes a first segment and a second segment, wherein a top surface of the second segment is located at a lower vertical level than a top surface of the first segment, and wherein a bottom surface of at least one of the first and second active patterns cover at least a portion of the top surface of the first segment.

BRIEF DESCRIPTION OF THE DRAWINGS

FIGS. 2A, 2B, and 2C illustrate cross-sectional views respectively taken along lines A-A', B-B', and C-C' of FIG. 1.

DETAILED DESCRIPTION

Figure 1:
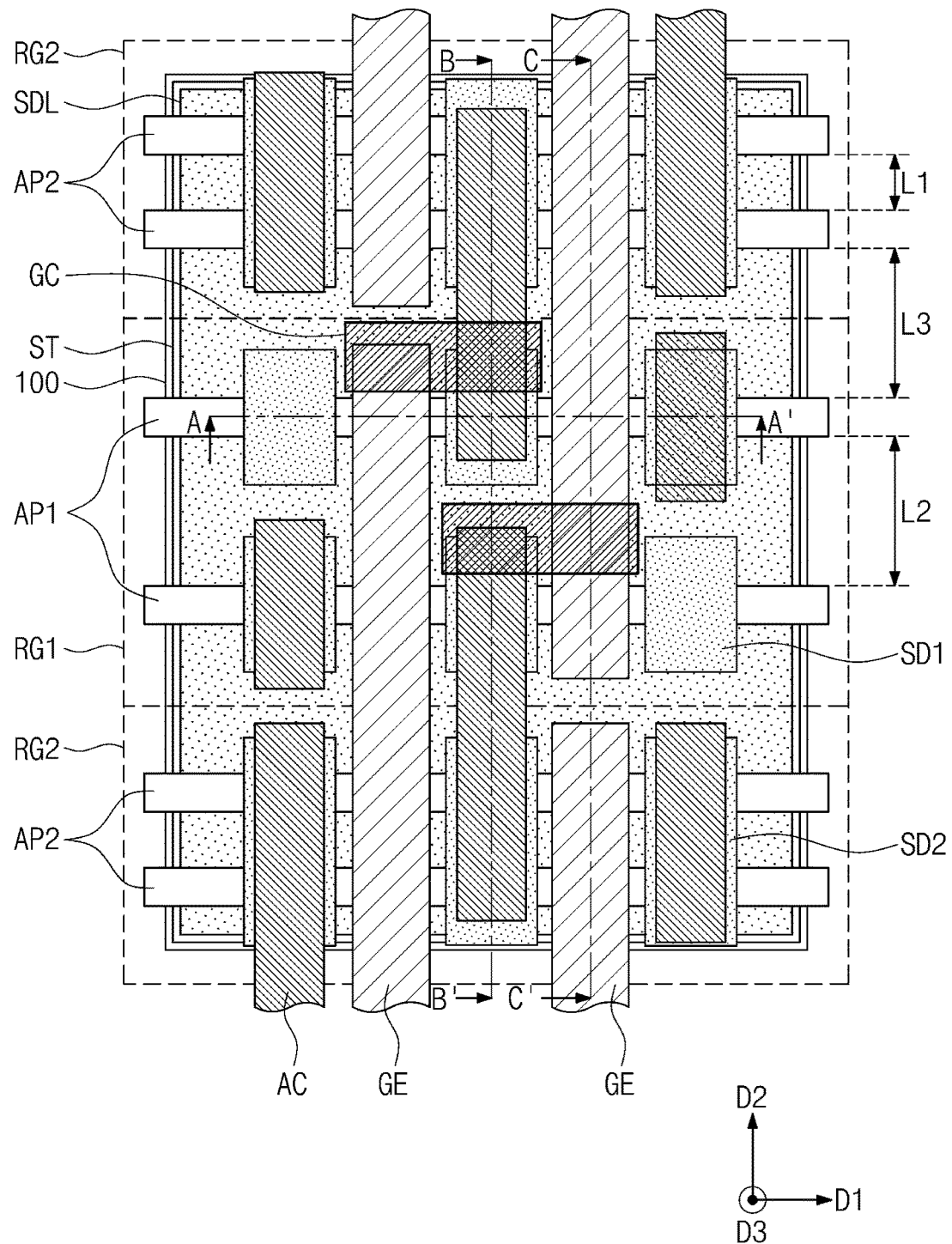
FIG. 1 illustrates a plan view showing a semiconductor device according to some example embodiments.
Figure 2A:
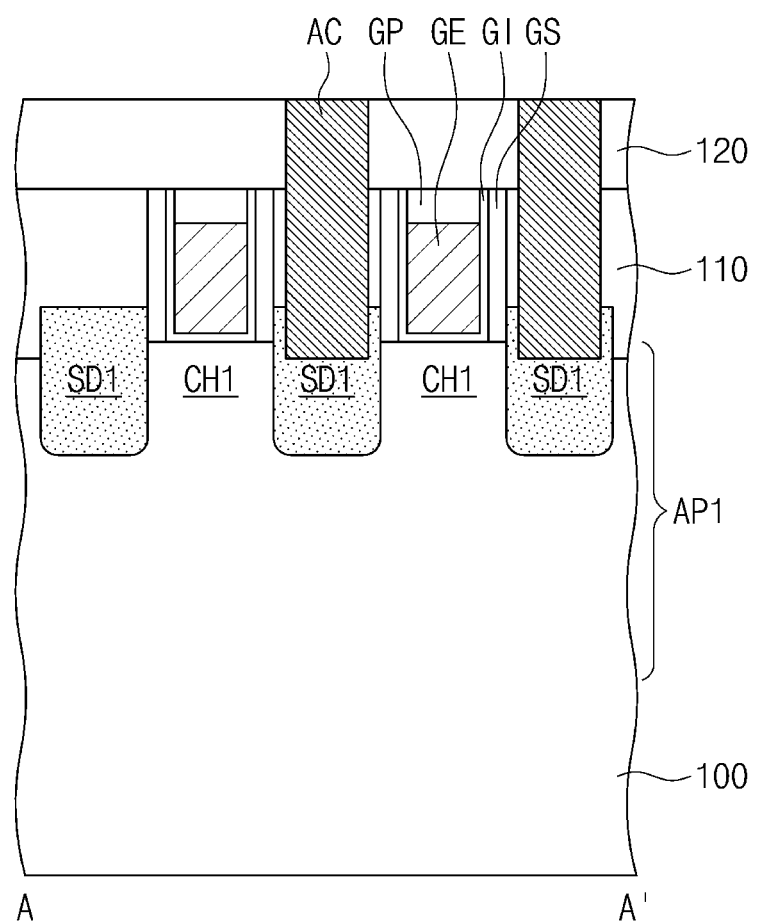
Figure 2A:
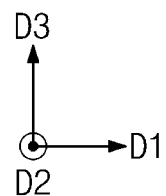
Figure 2C:
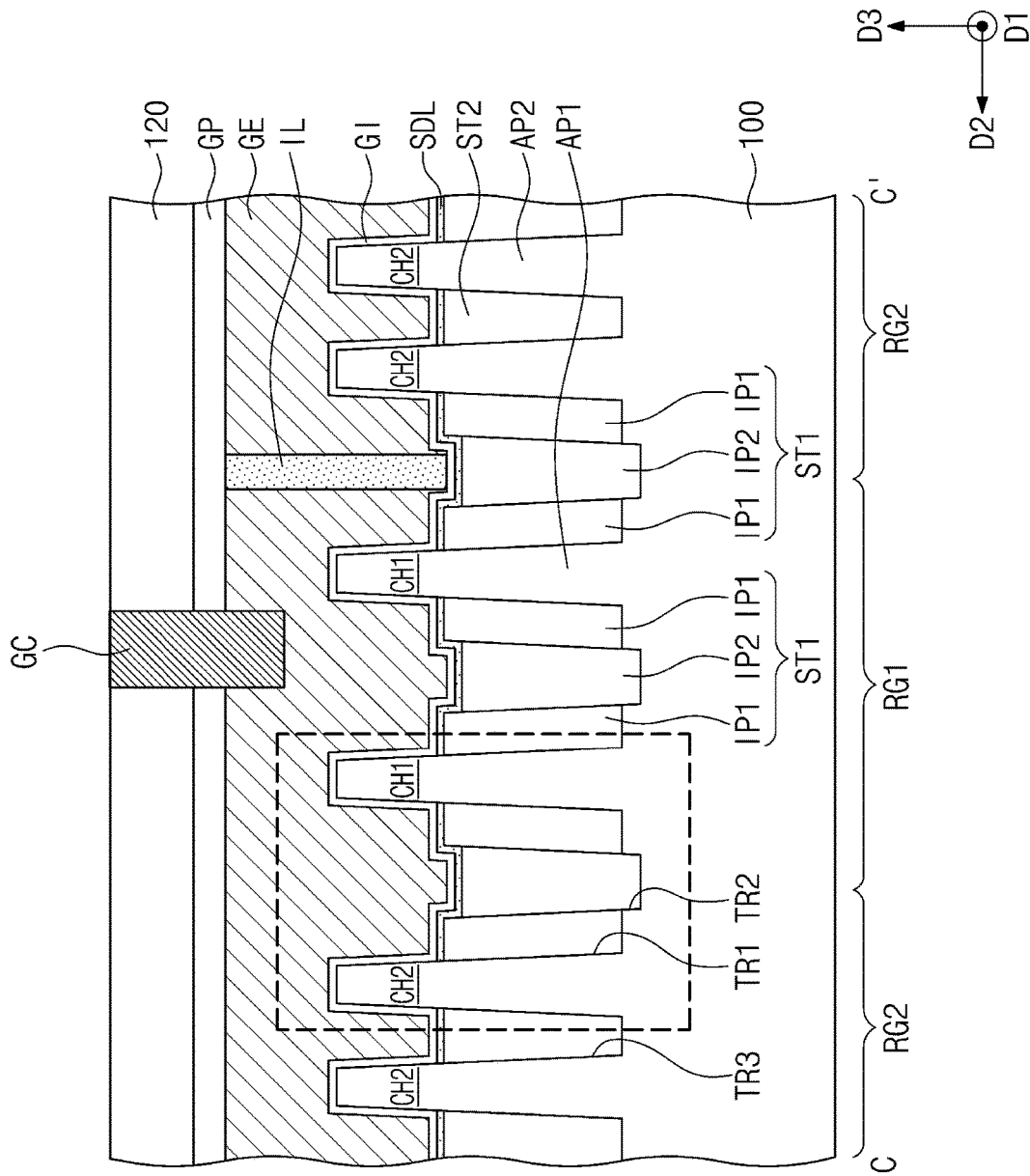
Figure 3A:
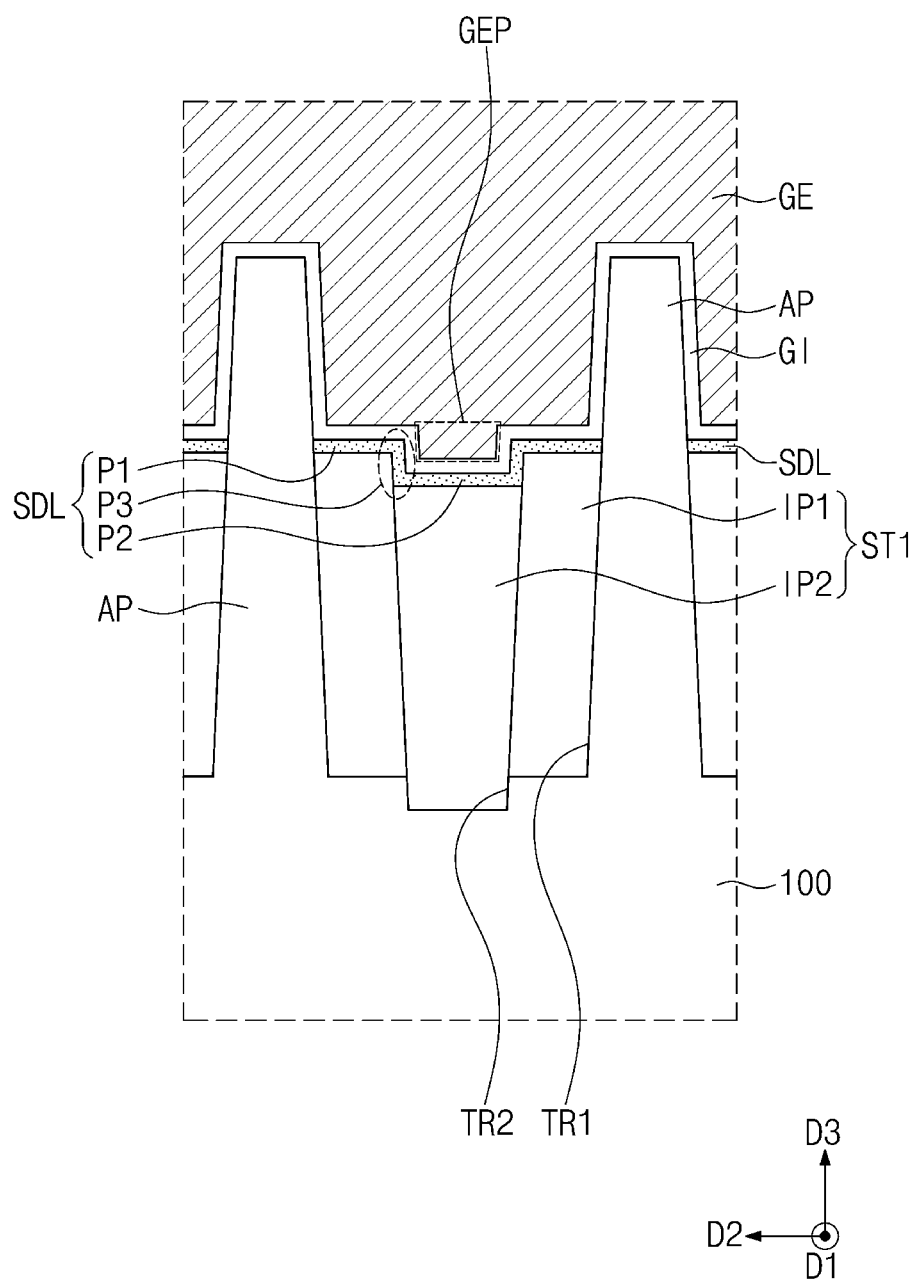
FIGS. 3A and 3B illustrate enlarged views showing portions of FIGS. 2C and 2B, respectively.
Figure 3B:
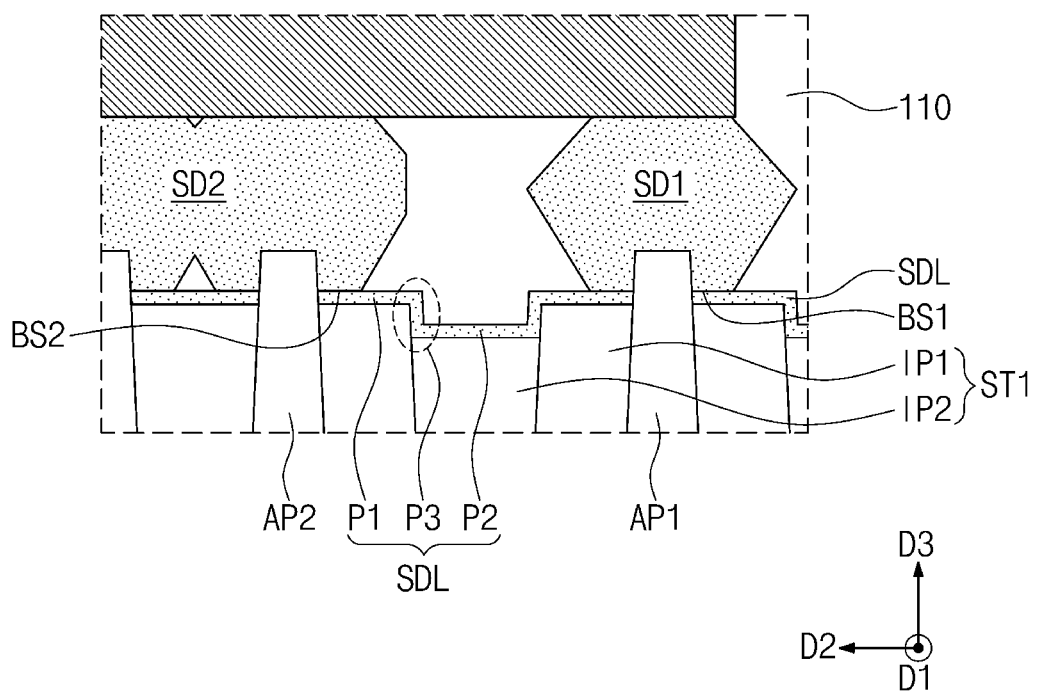
Figure 4:
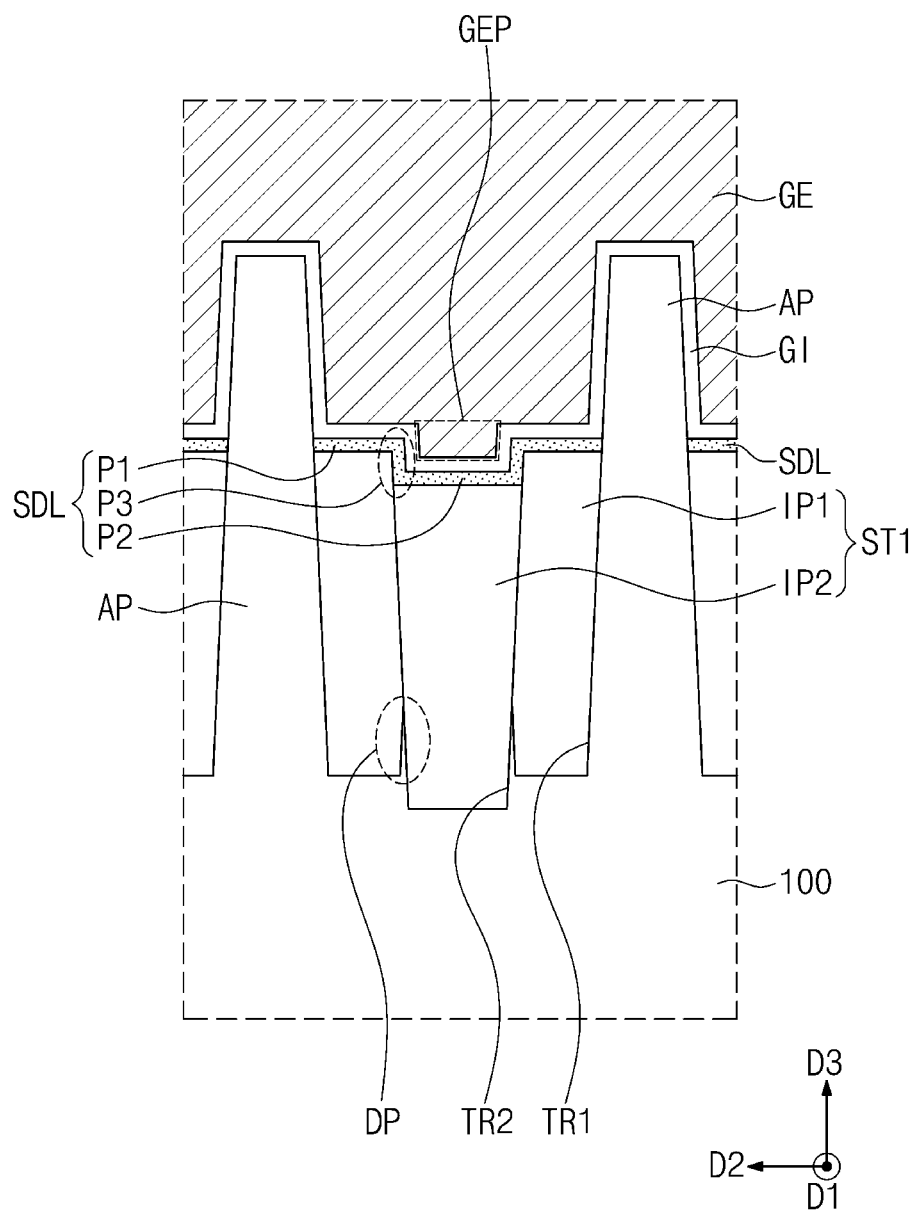
FIG. 4 illustrates an enlarged view showing a portion of FIG. 2C.

FIG. 1 illustrates a plan view showing a semiconductor device according to some example embodiments. FIGS. 2A, 2B, and 2C illustrate cross-sectional views respectively taken along lines A-A', B-B', and C-C' of FIG. 1. FIGS. 3A and 3B illustrate enlarged views showing portions of FIGS. 2C and 2B, respectively. FIG. 4 illustrates an enlarged view showing a portion of FIG. 2C.

Referring to FIGS. 1 and 2A to 2C, a substrate 100 may be provided. The substrate 100 may include a logic cell region and a memory cell region. The logic cell region of the substrate 100 may be provided thereon with logic transistors that constitute a logic circuit of a semiconductor device. For example, the semiconductor device may be a semiconductor chip formed on a die from a wafer, and may include a substrate with other layers and components formed thereon.

The memory cell region of the substrate 100 may be provided thereon with memory cell transistors that constitute, for example, a plurality of SRAM cells. The following will discuss an example in which the substrate 100 is provided thereon with memory cell transistors that constitute SRAM cells in order to easily understand technical features of the present inventive concepts. The present inventive concepts, however, are not limited to the example discussed below.

The substrate 100 may be a compound semiconductor substrate or a semiconductor substrate including silicon, germanium, silicon-germanium, or the like. The substrate 100 may include a first region RG1 and second regions RG2. The first region RG1 may be disposed between the second regions RG2. The first region RG1 may be an area where PMOS field effect transistors are disposed. The second regions RG2 may be areas where NMOS field effect transistors are disposed.

The substrate 100 may be provided thereon with first active patterns AP1 and second active patterns AP2. The first active patterns AP1 may extend in a first direction D1 at the first region RG1 of the substrate 100. The first active patterns AP1 may be spaced apart from each other in a second direction D2 intersecting the first direction D1. The second active patterns AP2 may extend in the first direction D1 at the second regions RG2 of the substrate 100. The second active patterns AP2 may be spaced apart from each other in the second direction D2. The first and second active patterns AP1 and AP2 may protrude in a third direction D3 respectively at the first and second regions RG1 and RG2 of the substrate 100. The first and second active patterns AP1 and AP2 may be described as protruding with respect to the substrate, and may be either part of the substrate (e.g., being formed by etching) or formed on the substrate (e.g., epitaxially grown). The third direction D3 may intersect the first and second directions D1 and D2. In some embodiments, the first direction D1, the second direction D2, and the third direction D3 may be perpendicular to one another.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

A length L2 between the first active patterns AP1 adjacent to each other may be less than a length L1 between the second active patterns AP2 adjacent to each other. A length L3 between the first and second active patterns AP1 and AP2 adjacent to each other may be substantially equal to the length L1 between the second active patterns AP2 adjacent to each other.

Device isolation layers ST may be provided on the substrate 100. The device isolation layers ST may define the first and second active patterns AP1 and AP2. The device isolation layers ST may include a dielectric material (e.g., a silicon oxide layer). The device isolation layers ST may include first device isolation layers ST1 and second device isolation layers ST2.

The first device isolation layers ST1 may be disposed between the first active patterns AP1. The first device isolation layers ST1 may also be disposed between the first and second active patterns AP1 and AP2 adjacent to each other. The first device isolation layer ST1 may include first isolation parts IP1 and a second isolation part IP2.

For example, referring to FIG. 3A, the first isolation parts IP1 of the first device isolation layer ST1 may be adjacent to facing sidewalls of active patterns AP, and the second isolation part IP2 of the first isolation layer ST1 may be disposed between the first isolation parts IP1. Each of the active patterns AP may be the first active pattern AP1 or the second active pattern AP2 discussed with reference to FIGS. 1 to 2C. The first isolation parts IP1 may extend lengthwise in the first direction D1 along lateral surfaces of the active patterns AP. The second isolation part IP2 may be disposed between facing lateral surfaces of the first isolation parts IP1. For example, the second isolation part IP2 may extend lengthwise in the first direction D1 in parallel to the first isolation parts IP1. Each of the first and second isolation parts IP1 and IP2 may have a flat top surface. The top surfaces of the first and second isolation parts IP1 and IP2 may be lower than a top surface of the substrate 100 (e.g., where the top surface of the substrate is the top surface of the active patterns AP). The top surface of the first isolation part IP1 may be located at a lower level than that of the top surface of the second isolation part IP2. In such cases, the lateral surface of the first isolation part IP1 may be partially exposed by the second isolation part IP2. For example, a side surface of an upper region of the first isolation parts IP1 may be exposed by a top surface of the second isolation part IP2.

The first isolation part IP1 may have a bottom surface at a higher level than that of a bottom surface of the second isolation part IP2. The bottom surface of the second isolation part IP2 may be located at a lower level than that of a top surface of the substrate 100. For example, the first isolation parts IP1 may be disposed in a first trench TR1. The first trench TR1 may be defined by facing sidewalls of the active patterns AP and a top surface of the substrate 100. The second isolation part IP2 may be disposed in a second trench TR2. The second trench TR2 may be positioned in the first trench TR1. The second trench TR2 may have a bottom surface at a lower level than that of a bottom surface of the first trench TR1. In some embodiments, when viewed in a cross-sectional view, the second trench TR2 may be centered in the first trench TR1, such that widths of the first trench TR1 on either side of the second trench TR2 are substantially the same.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Referring to FIG. 4, a dummy pattern DP may be disposed between the first and second isolation parts IP1 and IP2, and in particular between bottoms or bottom portions of the first and second isolation parts IP1 and IP2. The dummy pattern DP may protrude in the third direction D3 with respect to the substrate 100. For example, the dummy pattern DP may be a protruding portion of the substrate. A top end of the dummy pattern DP may be lower than a top end of each of the active patterns AP. The dummy pattern DP may be completely covered with the first device isolation layer ST1. The dummy pattern may protrude with respect to the substrate without being an active pattern, and may also be described as a wedge portion of the substrate. The dummy pattern may have a height significantly smaller than the height of the first or second isolation parts IP1 and IP2 (e.g., less than 10% or 20% of the height of the first or second isolation parts IP1 and IP2).

Referring back to FIGS. 1, 2A to 2C, and 3A, the second device isolation layers ST2 may be disposed between the second active patterns AP2 adjacent to each other. The second device isolation layer ST2 may have a top surface at the same level as that of the top surface of the first isolation part IP1 of the first device isolation layer ST1. The second device isolation layer ST2 may have a bottom surface at the same level as that of the bottom surface of the first isolation part IP1 of the first device isolation layer ST1. For example, the second device isolation layer ST2 may be disposed in a third trench TR3. The third trench TR3 may be defined by facing sidewalls of the second active patterns AP2 and a top surface of the substrate 100. The third trench TR3 may have a bottom surface at the same level as that of the bottom surface of the first trench TR1.

A passivation layer SDL may be disposed on the device isolation layers ST. The passivation layer SDL may cover top surfaces of the device isolation layers ST and expose upper portions of the active patterns AP. The passivation layer SDL may include a material having an etch selectivity with respect to the device isolation layers ST. The passivation layer SDL may include one or more of SiON, SiCN, SiCON, and SiN.

The passivation layer SDL on the first device isolation layer ST1 may include a stepped portion. The passivation layer SDL on the second device isolation layer ST2 may have a flat top surface. For example, the passivation layer SDL on the second device isolation layer ST2 may not include the stepped portion. In some embodiments, the passivation layer SDL may have a uniform thickness, and the thickness may be the same on both the first and second device isolation layers ST1 and ST2.

As shown in FIG. 3A, the passivation layer SDL may include at least one first segment P1, a second segment P2, and at least one third segment P3. The third segment P3 may be a stepped segment, providing a bridge between a first segment P1 and the second segment P2. For example, over each first device isolation layer ST1, the passivation layer SDL may include two horizontal first segments P1 and one horizontal second segment P2. Each horizontal first segment P1 may be connected to the horizontal second segment P2 by a vertical third segment P3. The first segment P1 of the passivation layer SDL may be positioned on the first isolation part IP1 of the first device isolation layer ST1. The second segment P2 of the passivation layer SDL may be positioned oil the second isolation part IP2 of the first device isolation layer ST1. The stepped segment P3 of the passivation layer SDL may connect the first and second segments P1 and P2 to each other. At least a portion of the stepped segment P3 may be positioned on the lateral surface of the first isolation part IP1.

First channels CH1 and first source/drain patterns SD1 may be provided at upper portions of the first active patterns AP1. Second channels CH2 and second source/drain patterns SD2 may be provided at upper portions of the second active patterns AP2. The first source/drain patterns SD1 may be p-type impurity regions. The second source/drain patterns SD2 may be n-type impurity regions. Each of the first channels CH1 may be interposed between a pair of the first source/drain patterns SD1, and each of the second channels CH2 may be interposed between a pair of the second source/drain patterns SD2.

The first and second source/drain patterns SD1 and SD2 may be epitaxial patterns formed by a selective epitaxial growth process. The first and second source/drain patterns SD1 and SD2 may have their top surfaces at a higher vertical level than that of top surfaces of the first and second channels CH1 and CH2. The first and second source/drain patterns SD1 and SD2 may include a semiconductor element the same as or different from that of the substrate 100. The first source/drain patterns SD1 may include a semiconductor element whose lattice constant is greater than that of a semiconductor element of the substrate 100. For example, the first source/drain patterns SD1 may include silicon-germanium (SiGe). The second source/drain patterns SD2 may include the same semiconductor element as that of the substrate 100. For example, the second source/drain pattern SD2 may include silicon (Si).

Referring to FIG. 3B, the first and second source/drain patterns SD1 and SD2 may have respective bottom surfaces BS1 and BS2 that cover at least a portion of a top surface of the passivation layer SDL. For example, the bottom surfaces BS1 and BS2 of the first and second source/drain patterns SD1 and SD2 may cover a top surface of the first segment P1 of the passivation layer SDL. The bottom surfaces BS1 and BS2 of the first and second source/drain patterns SD1 and SD2 may be parallel to the second direction D2. For example, the bottom surfaces BS1 and BS2 of the first and second source/drain patterns SD1 and SD2 may be parallel to a top surface of the substrate 100.

Gate electrodes GE may be provided to extend in the second direction D2, while running across the first and second active patterns AP1 and AP2. For example, the gate electrodes GE may extend lengthwise in a direction that is perpendicular to the lengthwise direction of the first and second active patterns AP1 and AP2. The gate electrodes GE may vertically overlap the first and second channels CH1 and CH2. The gate electrodes GE may include one or more of conductive metal nitride (e.g., titanium nitride or tantalum nitride) and metal (e.g., titanium, tantalum, tungsten, copper, or aluminum). The gate electrode GE may include a protrusion GEP that protrudes toward the substrate 100, which protrusion GEP may be positioned between the first isolation parts IP1. For example, the protrusion GEP may be centered above the second isolation part IP2. The protrusion GEP may have a narrower width in the second direction D2 than the second isolation part IP2.

A dielectric pattern IL may be interposed between the gate electrodes GE adjacent to each other in the first direction D1. The dielectric pattern IL may separate the gate electrodes GE adjacent to each other, electrically isolating adjacent gate electrodes GE from one another.

A pair of gate spacers GS may be disposed on opposite sidewalls of each of the gate electrodes GE. The gate spacers GS may extend lengthwise in the second direction D2 along the gate electrodes GE. The gate spacers GS may have top surfaces higher than those of the gate electrodes GE. The top surfaces of the gate spacers GS may be coplanar with a top surface of a first interlayer dielectric layer 110, which will be discussed below. The gate spacers GS may include one or more of SiO$_2$, SiCN, SiCON, and SiN. Alternatively, the gate spacers GS may include a multiple layer consisting of two or more of SiO$_2$, SiCN, SiCON, and SiN.

Gate dielectric layers GI may be interposed between the gate electrodes GE and the first active patterns AP1 and between the gate electrodes GE and the second active patterns AP2. For example, the gate dielectric layer GI may be interposed between the gate electrodes GE and the corresponding gate spacers GS. Each of the gate dielectric layers GI may extend along a bottom surface of a corresponding one of the gate electrodes GE. For example, portions of the gate dielectric layers GI may be positioned on top surfaces of the first and second device isolation layers ST1 and ST2, covering a top surface of the passivation layer SDL. Each of the gate dielectric layers GI may cover the top surface and opposite sidewalls of each of the first and second channels CH1 and CH2. The gate dielectric layers GI may include a high-k dielectric material. The high-k dielectric material may include, for example, one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern GP may be provided on each of the gate electrodes GE. The gate capping patterns GP may extend lengthwise in the second direction D2 along the gate electrodes GE. The gate capping pattern GP may be interposed between a pair of the gate spacers GS. The gate capping patterns GP may include a material having an etch selectivity with respect to first and second interlayer dielectric layers 110 and 120, which will be discussed below. The gate capping patterns GP may include, for example, one or more of SION, SiCN, SiCON, and SiN.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers the top surfaces of the gate capping patterns GP and the top surfaces of the gate spacers GS.

Active contacts AC may be provided on opposite sides of each of the gate electrodes GE. The active contacts AC may penetrate the first and second interlayer dielectric layers 110 and 120, and may be coupled to the first and second source/drain patterns SD1 and SD2. The active contacts AC may have top surfaces coplanar with that of the second interlayer dielectric layer 120. The active contacts AC may include one or more of conductive metal nitride (e.g., titanium nitride or tantalum nitride) and metal (e.g., titanium, tantalum, tungsten, copper, or aluminum).

Gate contacts GC may be provided on the gate electrodes GE. Each of the gate contacts GC may be coupled to the gate electrode GE, while penetrating the second interlayer dielectric layer 120, the first interlayer dielectric layer 110, and the gate capping pattern GP. The gate contacts GC may have top surfaces coplanar with that of the second interlayer dielectric layer 120 and the active contacts AC. The gate contacts GC may have bottom surfaces higher than those of the active contacts AC.

The gate contacts GC may include one or more of conductive metal nitride (e.g., titanium nitride or tantalum nitride) and metal (e.g., titanium, tantalum, tungsten, copper, or aluminum). The gate contacts GC may include the same material as that of the active contacts AC. The gate contact GC and its connected active contact AC may constitute a single conductive structure.

Figure 12A:
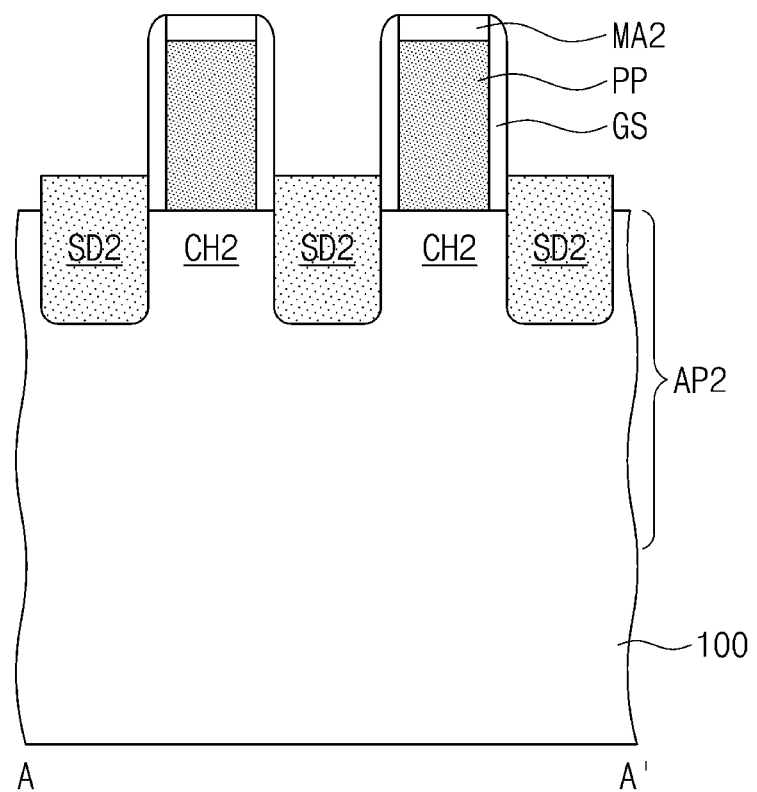
Figure 12B:
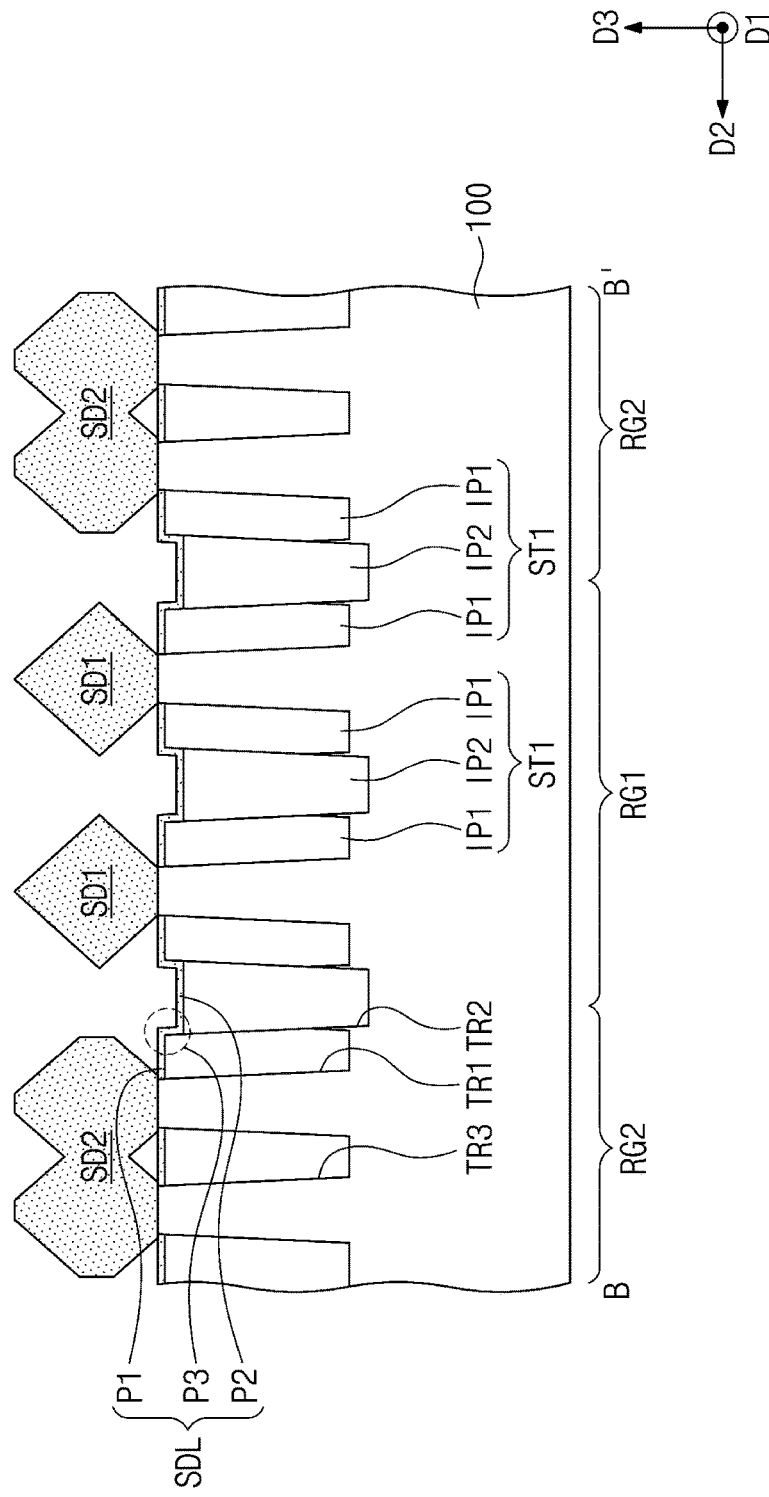
Figure 12C:
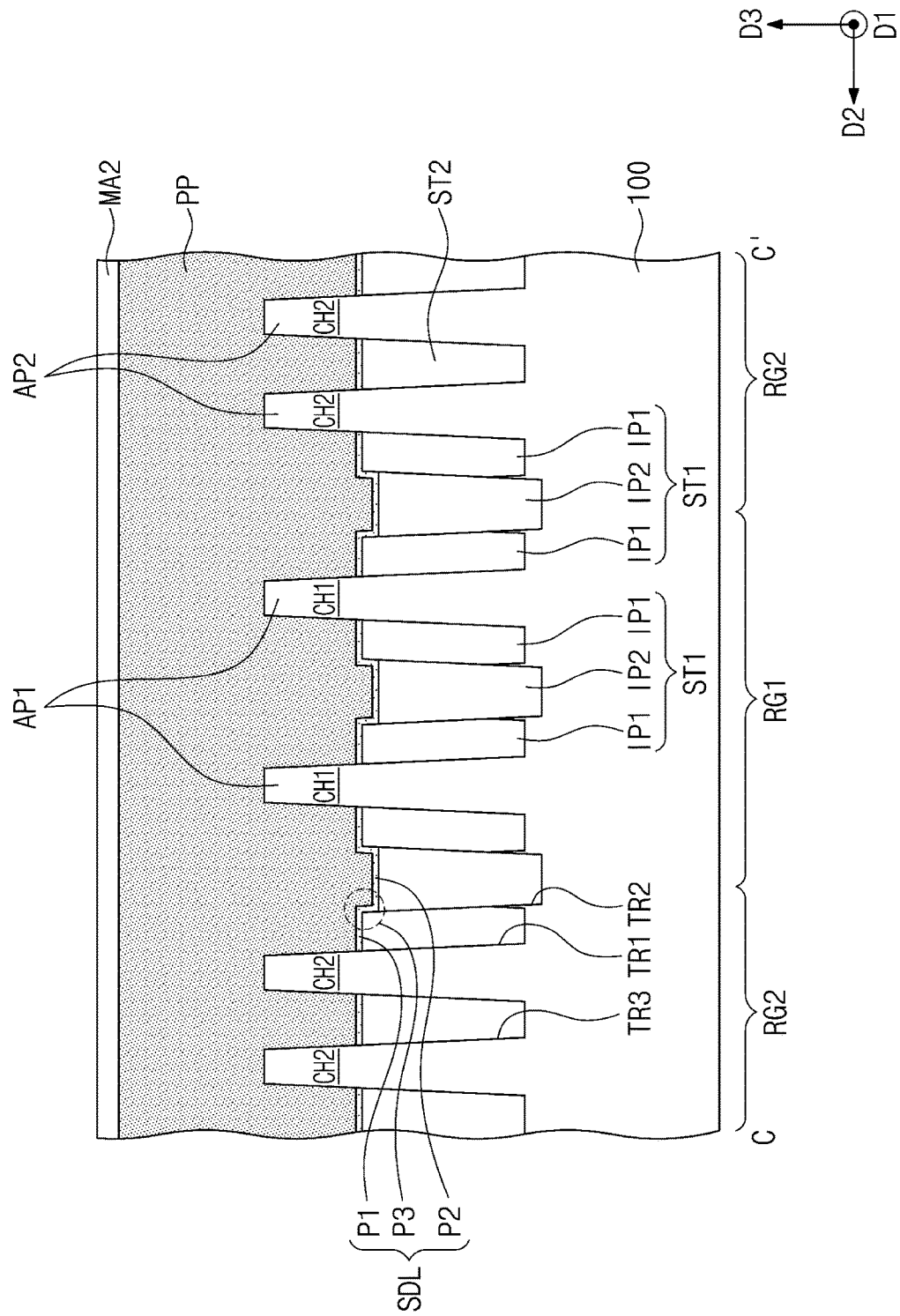
FIGS. 12C and 14C illustrate cross-sectional views taken along line C-C' of FIGS. 11 and 13, respectively.
Figure 13:
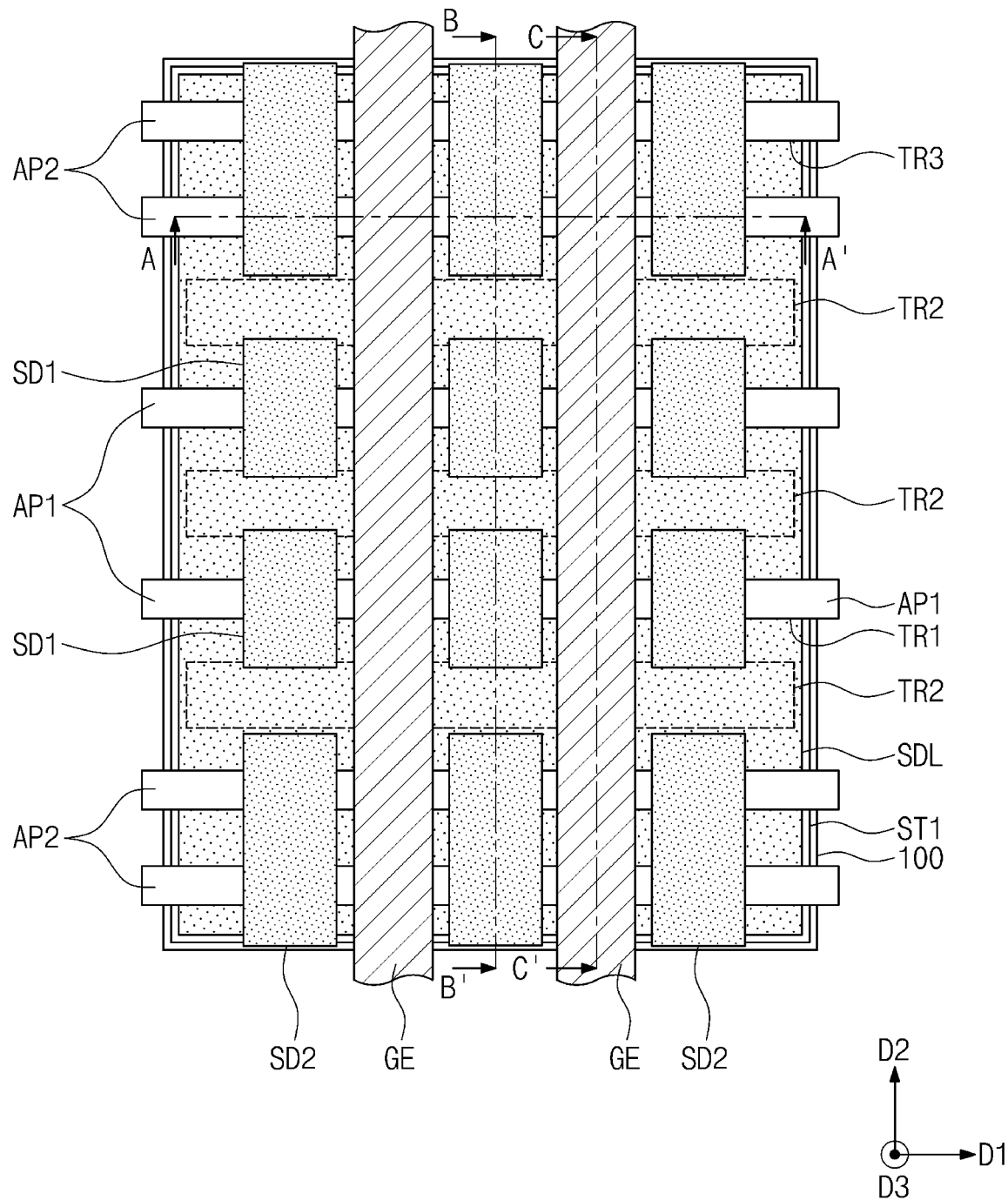
Figure 14A:
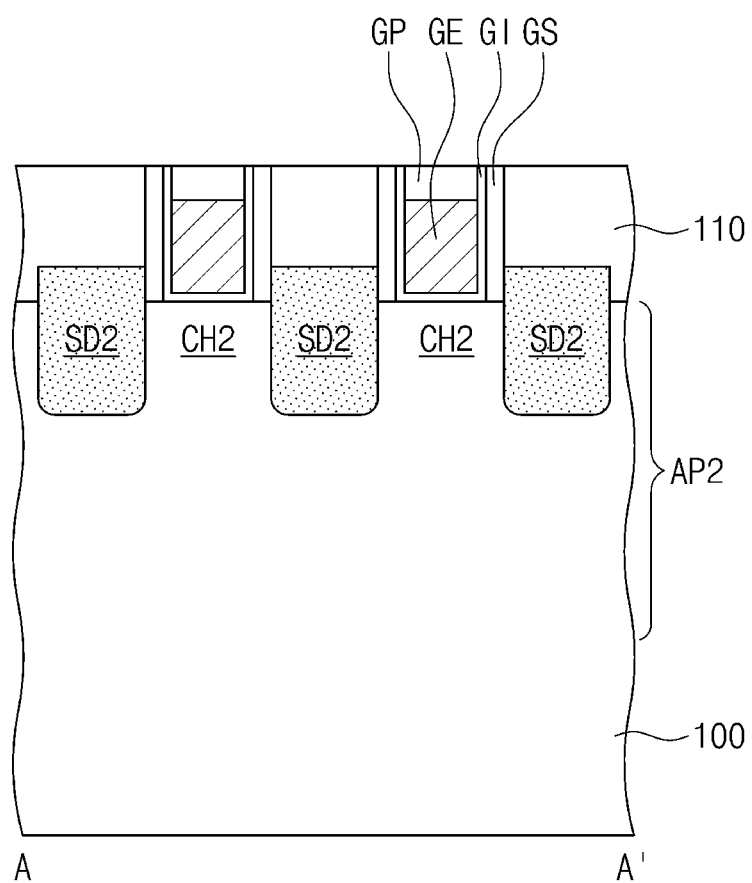
Figure 14B:
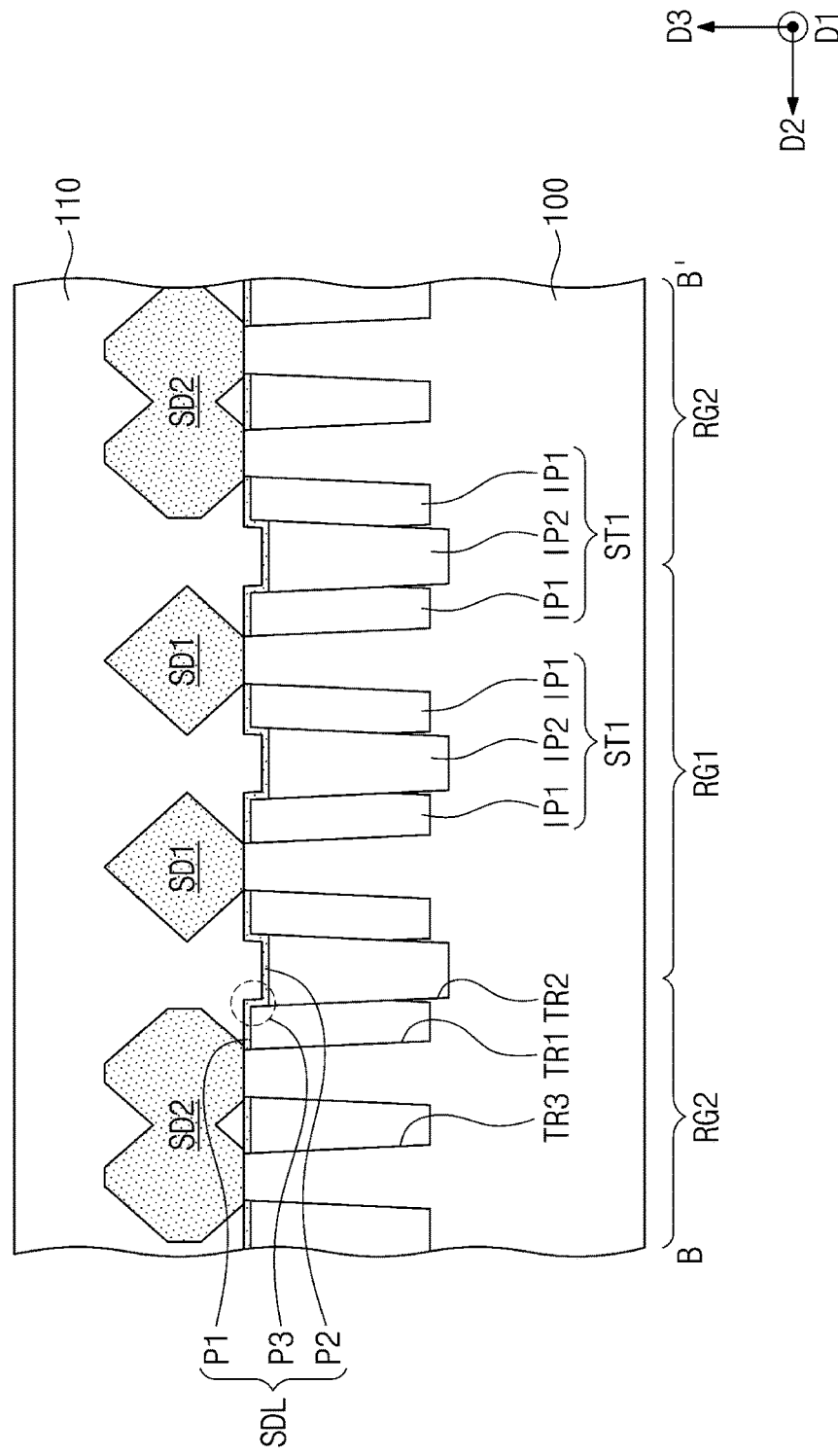
Figure 14C:
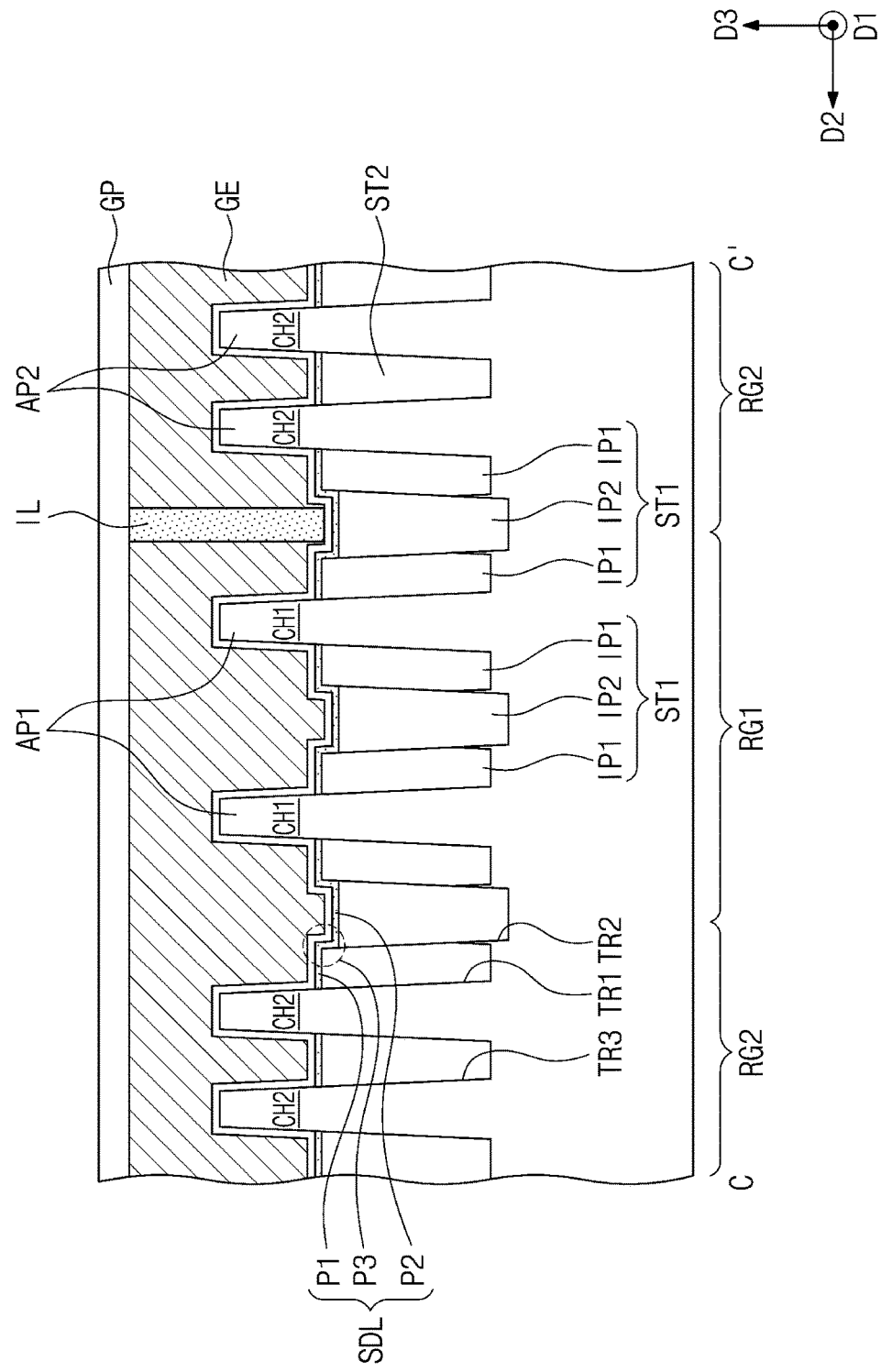

FIGS. 5, 7, 9, 11, and 13 illustrate plan views showing a method of manufacturing a semiconductor device according to some example embodiments. FIGS. 6A, 8A, 10A, 12A, and 14A illustrate cross-sectional views taken along line A-A' of FIGS. 5, 7, 9, 11, and 13, respectively. FIGS. 6B, 8B, 10B, 12B, and 14B illustrate cross-sectional views taken along line B-B' of FIGS. 5, 7, 9, 11, and 13, respectively. FIGS. 12C and 14C illustrate cross-sectional views taken along line C-C' of FIGS. 11 and 13, respectively.

Figure 5:
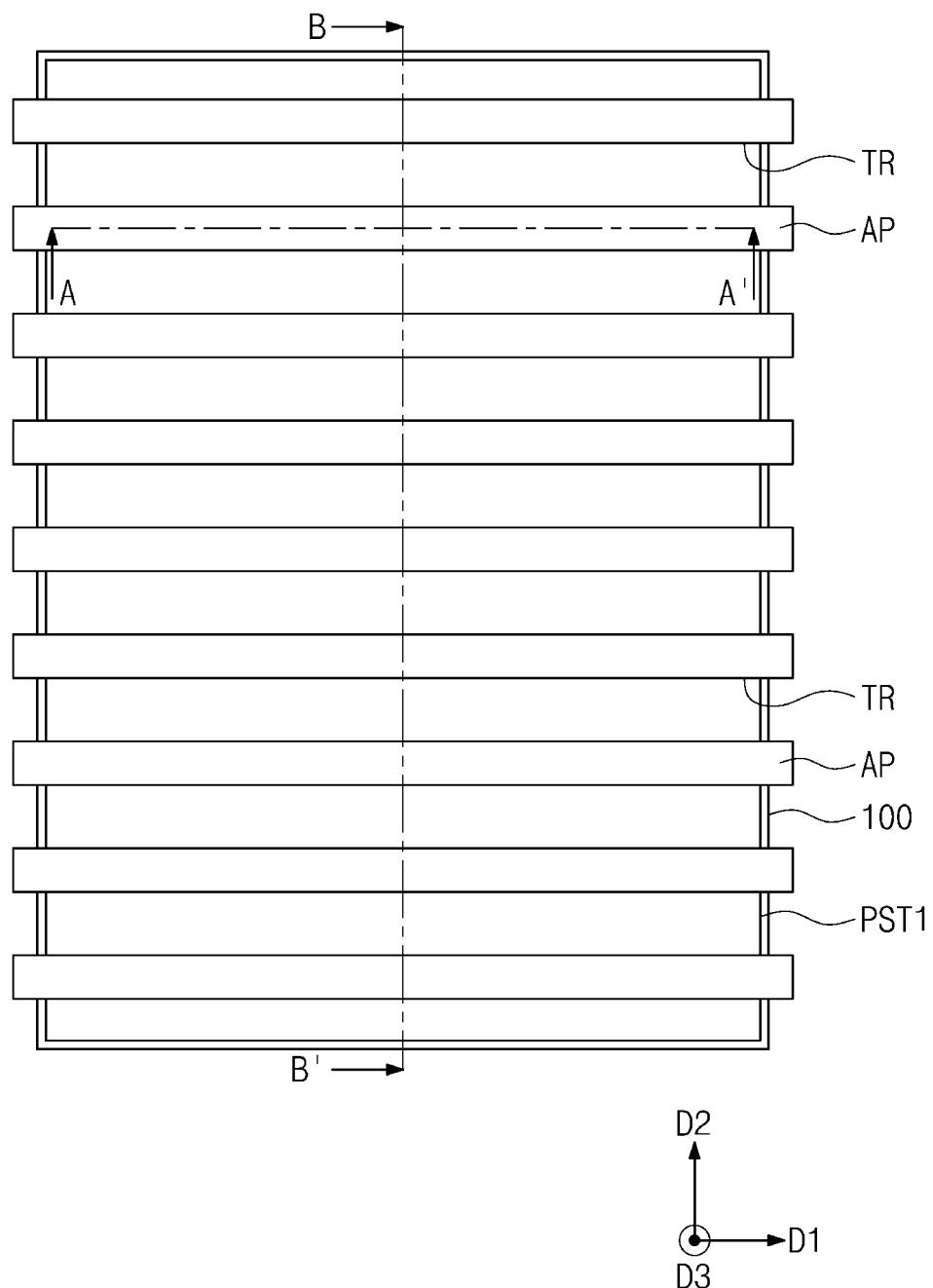
FIGS. 5, 7, 9, 11, and 13 illustrate plan views showing a method of manufacturing a semiconductor device according to some example embodiments.
Figure 6A:
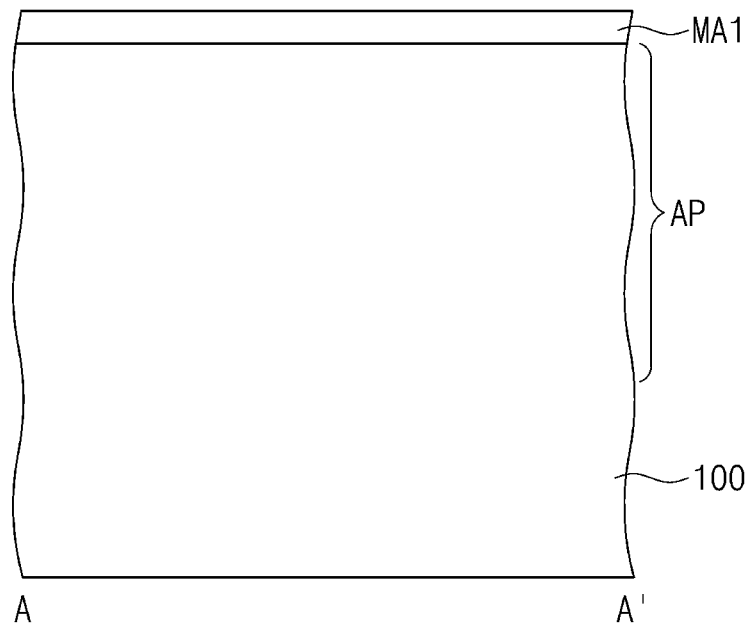
FIGS. 6A, 8A, 10A, 12A, and 14A illustrate cross-sectional views taken along line A-A' of FIGS. 5, 7, 9, 11, and 13, respectively.
Figure 6A:
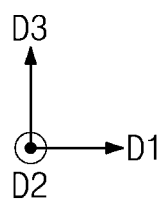
Figure 6B:
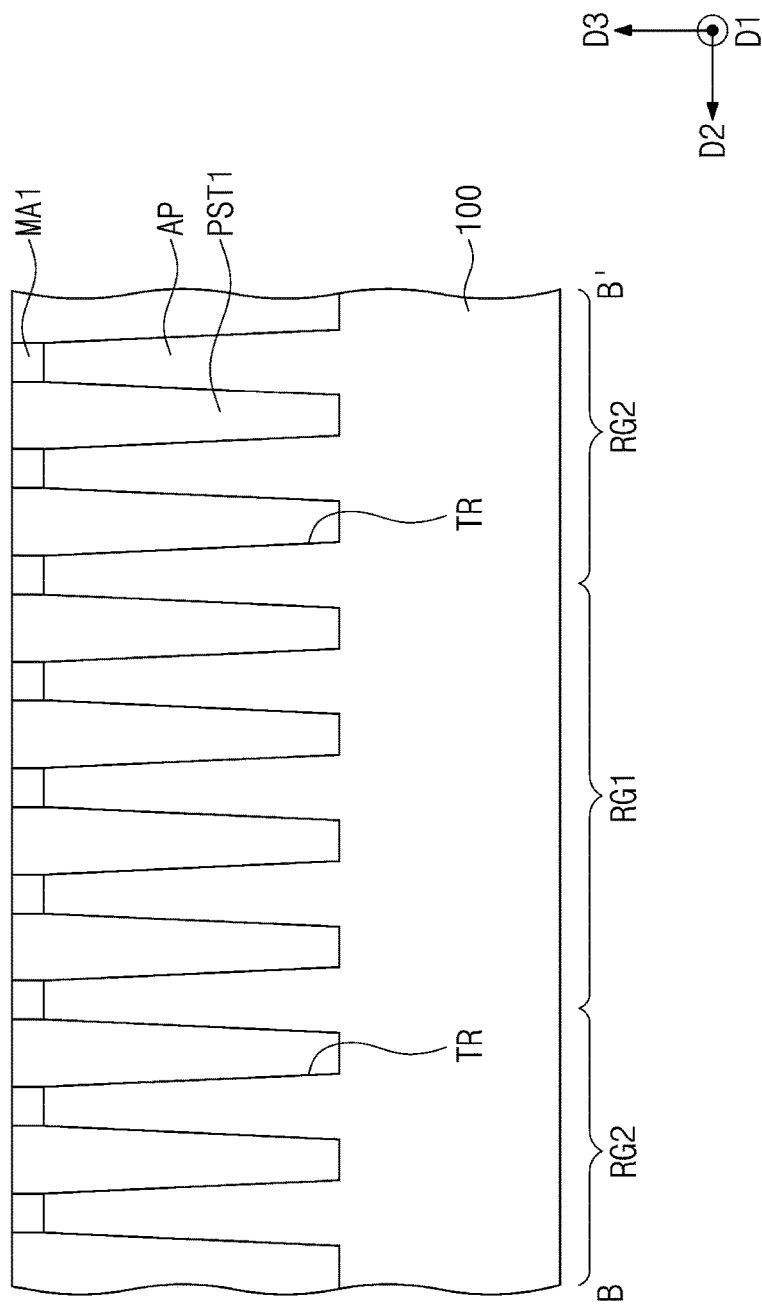
FIGS. 6B, 8B, 10B, 12B, and 14B illustrate cross-sectional views taken along line B-B' of FIGS. 5, 7, 9, 11, and 13, respectively.

Referring to FIGS. 5, 6A, and 6B, a substrate 100 may be patterned to form active patterns AP. The substrate 100 may include a first region RG1 and second regions RG2. The active patterns AP may be arranged at a regular pitch. For example, the same length may be provided between neighboring ones of the active patterns AP. The formation of the active patterns AP may include forming a first mask pattern MA1 on the substrate 100 and using the first mask pattern MA1 as an etching mask to anisotropically etch the substrate 100. A trench TR may be formed between a pair of neighboring active patterns AP.

A first dielectric pattern PST1 may be formed to fill a space between the active patterns AP. For example, the first dielectric pattern PST1 may be formed to fill trenches TR between the active patterns AP. The formation of the first dielectric pattern PST1 may include forming a first preliminary dielectric pattern (not shown) to fill the trenches TR, performing a first annealing process on the first preliminary dielectric pattern, and performing on the first preliminary dielectric pattern a planarization process to expose the first mask pattern MA1. The first preliminary dielectric pattern may be formed using, for example, a flowable chemical vapor deposition (FCVD) process or toner silazene (TOSZ). A chemical mechanical polishing process may be employed as the planarization process. The first dielectric pattern PST1 may include, for example, silicon oxide.

Figure 7:
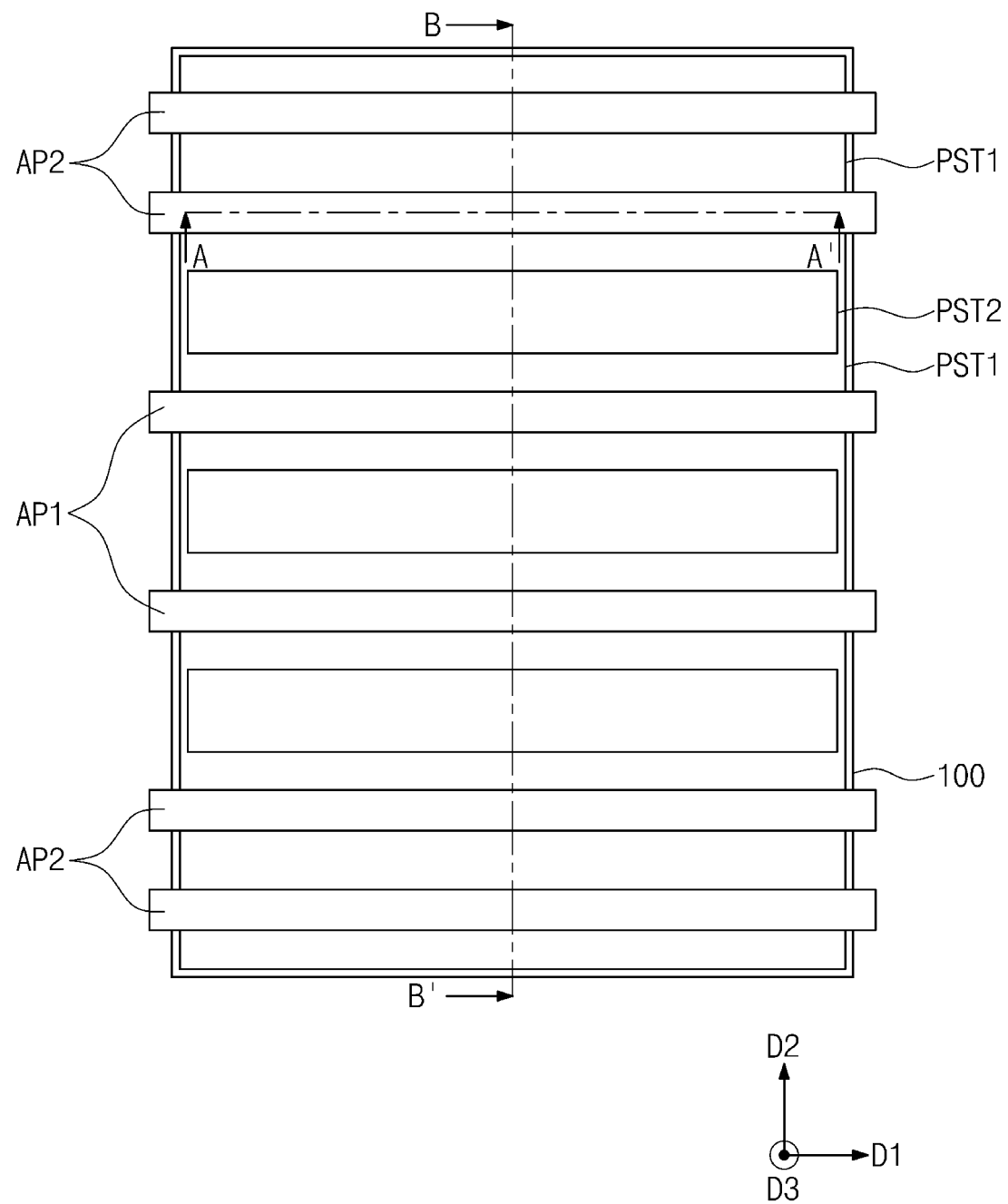
Figure 8A:
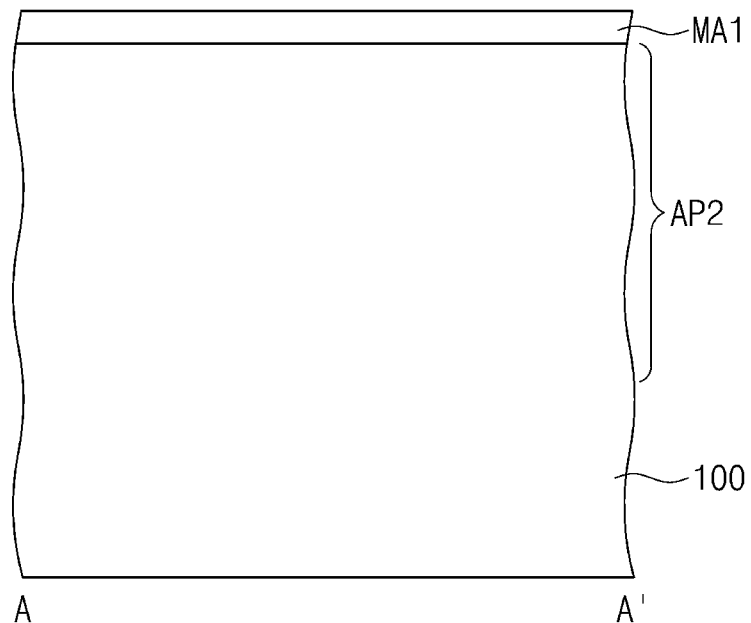
Figure 8A:
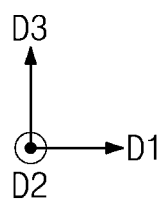
Figure 8B:
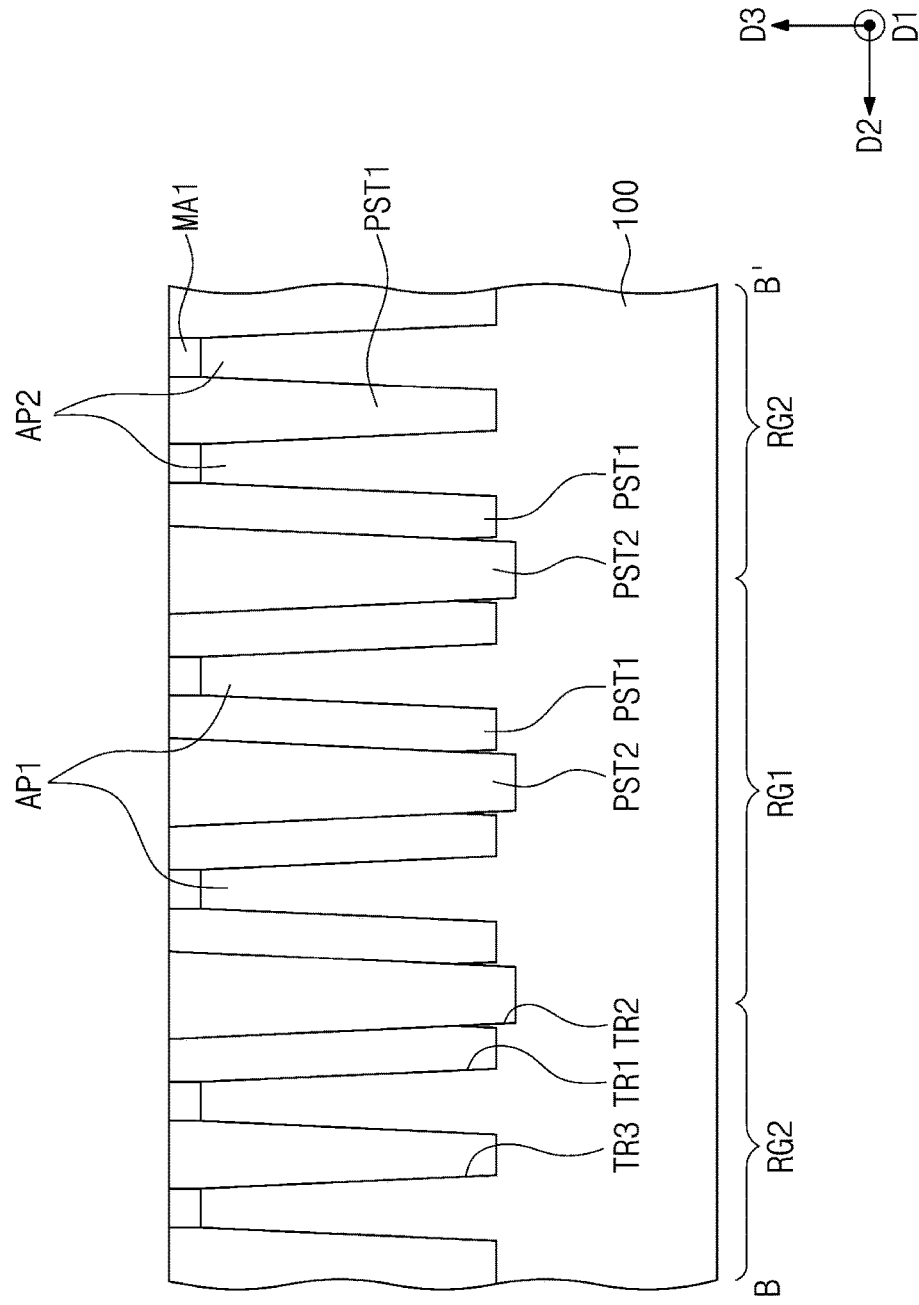

Referring to FIGS. 7, 8A, and 8B, the substrate 100 may undergo a patterning process to remove ones of the active patterns AP. The active patterns AP on the first region RG1 may be called first active patterns AP1, and the active patterns AP on the second region RG2 may be called second active patterns AP2. The patterning process may remove the first active pattern AP1 immediately next to the second active pattern AP2. In addition, the patterning process may also remove the first active pattern AP1 second next to the removed first active pattern AP1. For example, the patterning process may remove first active patterns AP1 on either side of first region RG1 and the first active pattern AP1 at the center of the first region RG1. Therefore, the pitch between the first active patterns AP1 may become different from that between the second active patterns AP2.

For example, the substrate 100 may undergo a patterning process to form second trenches TR2. The second trenches TR2 may be formed between the first active pattern AP1 and the second active pattern AP2 and between the first active patterns AP1. The formation of the second trenches TR2 may define a first trench TR1 between a sidewall of the first active pattern AP1 and a sidewall of the second active pattern AP2. The first trench TR1 may also be defined between facing sidewalls of the second active patterns AP2. The first dielectric pattern PST1 may be exposed on its sidewalk by the second trench TR2. The second trenches TR2 may be deeper than the first trenches TR1. The second trench TR2 may have a bottom surface at a lower level than that of a bottom surface of the first trench TR1.

In some example embodiments, when the second trenches TR2 are formed, the removal-target first active patterns AP1 may not be completely removed but may partially remain. The remaining portion of the first active pattern AP1 may constitute a dummy pattern (see DP of FIG. 4).

A second dielectric pattern PST2 may be formed to fill a space between the side surfaces of first dielectric pattern PST1 that are exposed by the second trenches TR2. For example, the second dielectric pattern PST2 may be formed to fill the second trenches TR2. The formation of the second dielectric pattern PST2 may include forming a second preliminary dielectric pattern to fill the second trenches TR2, performing a second annealing process on the second preliminary dielectric pattern, and performing on the second preliminary dielectric pattern a planarization process to expose the first mask pattern MA1. The second dielectric pattern PST2 may include, for example, silicon oxide. The first and second annealing processes may include, for example, low temperature annealing, flash lamp annealing, laser annealing, or spike annealing.

Figure 9:
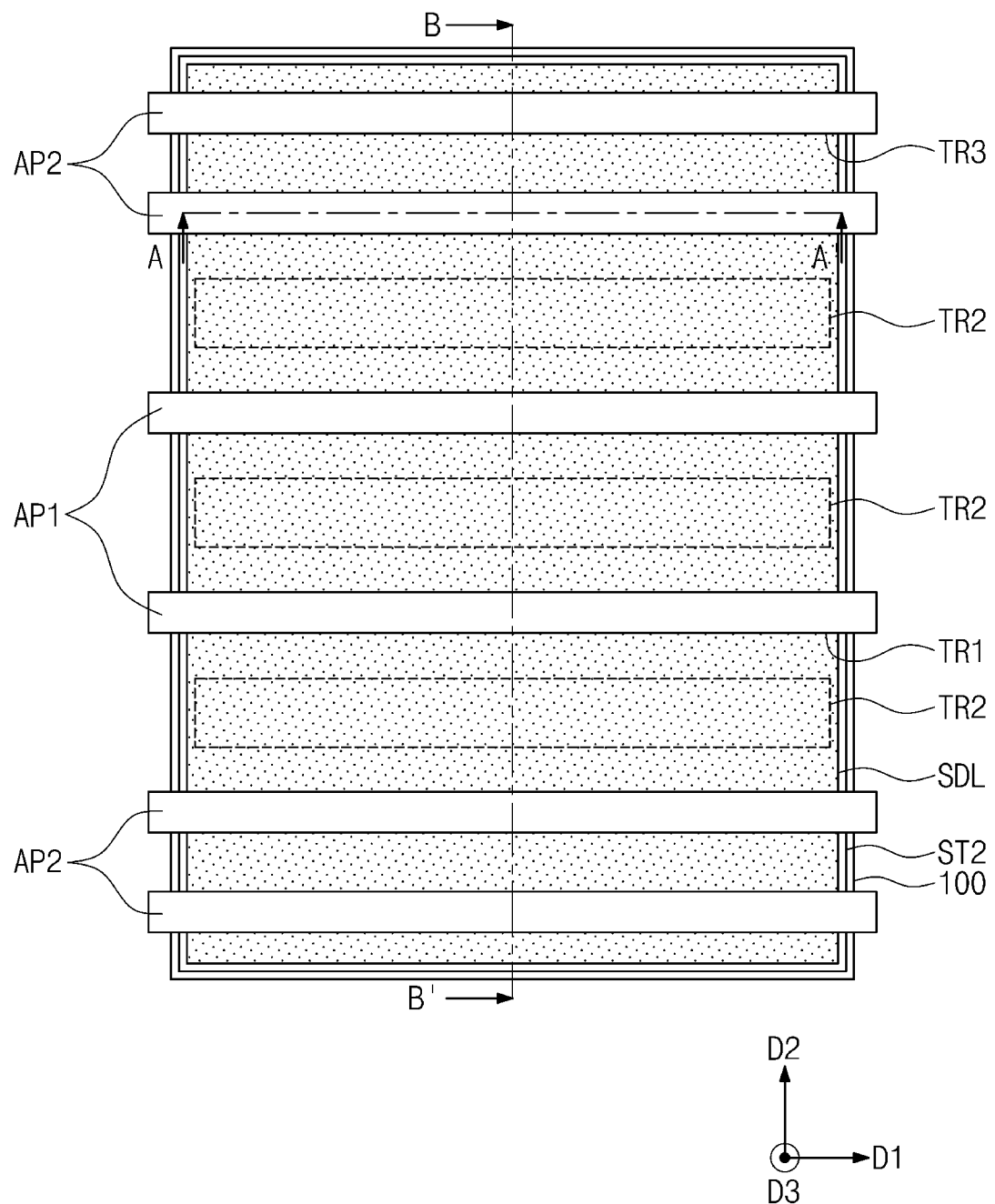
Figure 10A:
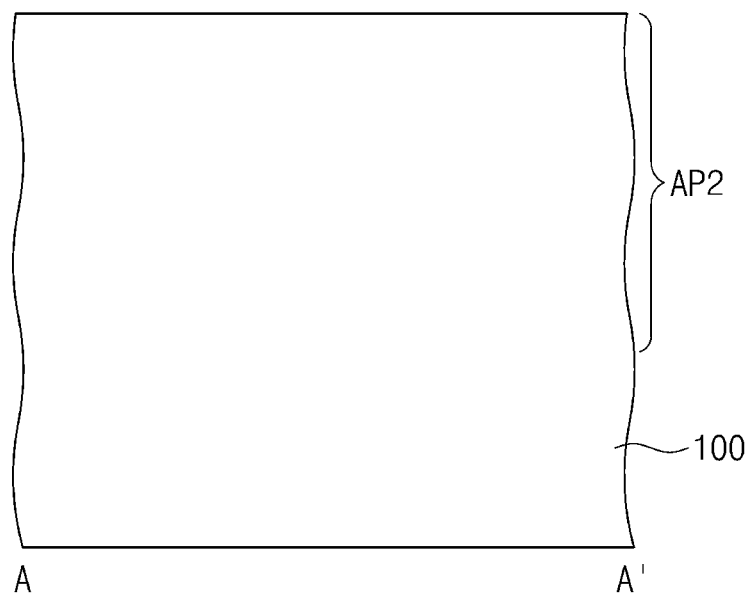
Figure 10A:
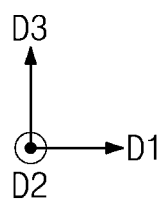
Figure 10B:
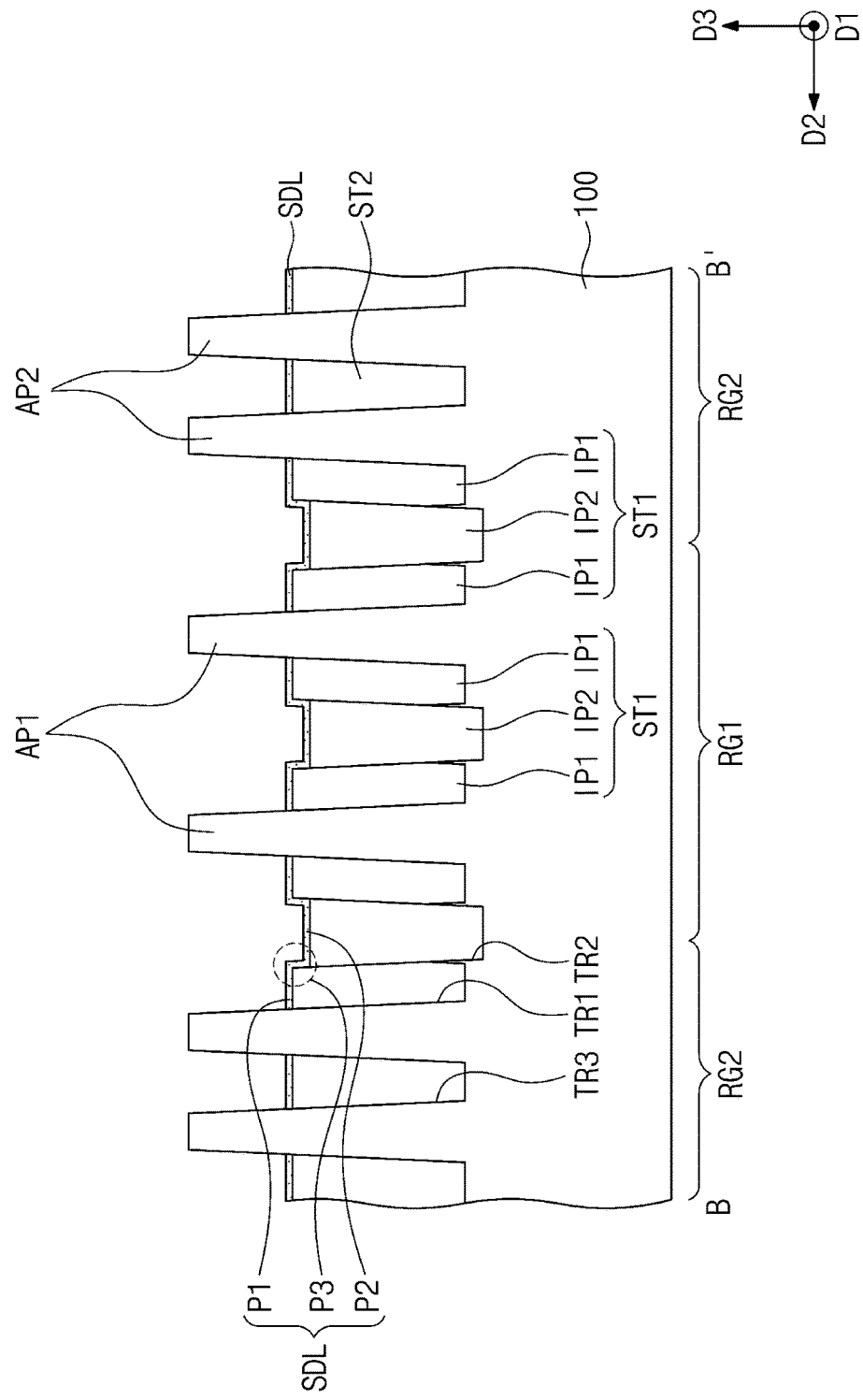
Figure 11:
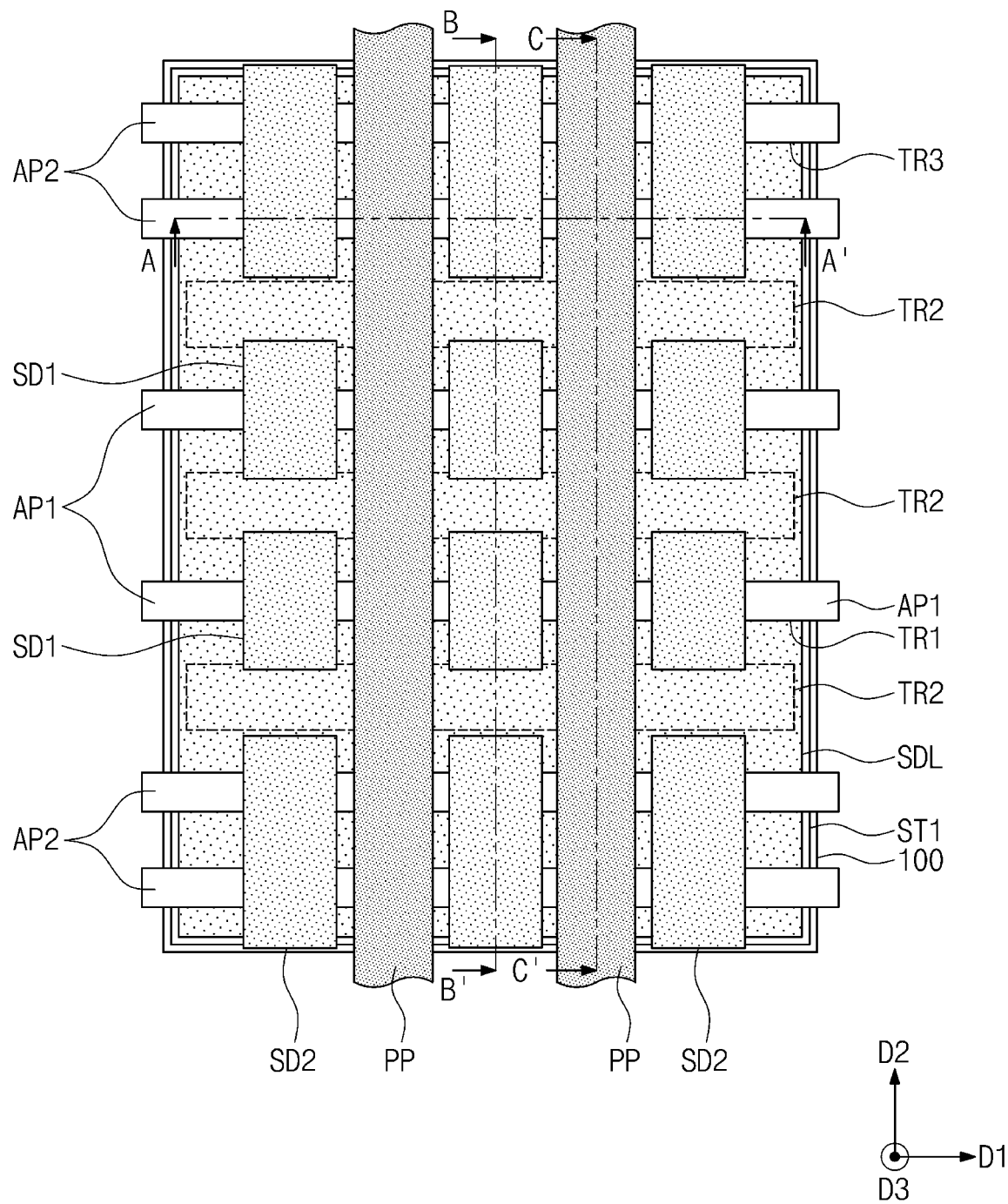

Referring to FIGS. 9, 10A, and 10B, the first and second dielectric patterns PST1 and PST2 may be recessed to form a first device isolation layer ST1 and a second device isolation layer ST2. Because the first and second dielectric patterns PST1 and PST2 are recessed, the first and second active patterns AP1 and AP2 may be exposed on their upper portions. An etching process may be performed on the first and second dielectric patterns PST1 and PST2. Because the first dielectric pattern PST1 is formed through the first and second annealing processes, the first dielectric pattern PST1 may have a greater hardness (or strength) than that of the second dielectric pattern PST2. The first dielectric pattern PST1 may have a greater etching resistance than that of the second dielectric pattern PST2. When the etching process is performed on the first and second dielectric patterns PST1 and PST2, the second dielectric pattern PST2 may be more recessed than the first dielectric pattern PST1. For example, a top surface of the second dielectric pattern PST2 may be at a lower vertical level than that of the first dielectric pattern PST1. The first dielectric pattern PST1 between neighboring second active patterns AP2 may be recessed to form the second device isolation layer ST2. The first and second dielectric patterns PST1 and PST2 between neighboring first active patterns AP1 or between neighboring first and second active patterns AP1 and AP2 may be recessed to form the first device isolation layer ST1. The first device isolation layer ST1 may include first isolation parts IP1 formed of the recessed first dielectric patterns PST1, and also include a second isolation part IP2 formed of the recessed second dielectric pattern PST2 and disposed between the first isolation parts IP1. Top surfaces of the first dielectric pattern PST1 between neighboring second active patterns AP2, between neighboring first active patterns AP1, and between neighboring first and second active patterns AP1 and AP2 may be at the same vertical level.

A passivation layer SDL may be formed on the first and second device isolation layers ST1 and ST2. The passivation layer SDL may be selectively deposited on the first and second device isolation layers ST1 and ST2. The passivation layer SDL may not be deposited on the first and second active patterns AP1 and AP2. The formation of the passivation layer SDL may include performing a selective chemical vapor deposition process.

The selective chemical vapor deposition process may include repeatedly exposing the substrate 100 to a first precursor, a second precursor, a third precursor, and a purge gas. A difference in reactivity between surfaces of the first and second isolation layers ST1 and ST2 and surfaces of the first and second active patterns AP1 and AP2 may cause the first precursor to be selectively adsorbed on the surfaces of the first and second active patterns AP1 and AP2. The first precursor may interfere with adsorption of the second precursor onto the surfaces of the first and second active patterns AP1 and AP2. Thus, the second precursor may be selectively adsorbed oil the surfaces of the first and second device isolation layers ST1 and ST2. The third precursor may react with the second precursor, with the result that a portion of the passivation layer SDL may be formed. The purge gas may remove residues of the first to third precursors. The above-mentioned processes may be repeatedly performed to form the passivation layer SDL. The passivation layer SDL may include a first segment P1 formed on the first isolation part IP1 of the first device isolation layer ST1, a second segment P2 formed on the second isolation part IP2 of the first device isolation layer ST1, and a stepped segment P3 between the first and second segments P1 and P2. The first segment P1 may contact a sidewall of one of the first and second active patterns AP1 and AP2.

A uniform thickness may be given to the passivation layer SLD formed by the selective chemical vapor deposition process. For example, the first segment P1 of the passivation layer SDL may have a uniform thickness.

Referring to FIGS. 11 and 12A to 12C, sacrificial patterns PP may be formed to run across the first and second active patterns AP1 and AP2. Each of the sacrificial patterns PP may have a linear shape that extends lengthwise in a first direction D1. For example, the formations of the sacrificial patterns PP may include forming a sacrificial layer on an entire surface of the substrate 100, forming second mask patterns MA2 on the sacrificial layer, and using the second mask patterns MA2 as an etching mask to pattern the sacrificial layer. The sacrificial layer may include a polysilicon layer.

A pair of gate spacers GS may be formed on opposite sidewalls of each of the sacrificial patterns PP. The gate spacers GS may also be formed on opposite sidewalk of each of the first and second active patterns AP1 and AP2. The formation of the gate spacers GS may include conformally forming a spacer layer on the entire surface of the substrate 100 and anisotropically etching the spacer layer. The spacer layer may include one or more of $SiO_2$, SiCN, SiCON, and SiN. Alternatively, the spacer layer may include a multiple layer consisting of two or more of $SiO_2$, SiCN, SiCON, and SiN.

First and second source/drain patterns SD1 and SD2 may be formed on opposite sides of each of the sacrificial patterns PP. The first source/drain patterns SD1 may be formed at upper portions of the first active patterns AP1, and the second source/drain patterns SD2 may be formed at upper portions of the second active patterns AP2.

The first and second source/drain patterns SD1 and SD2 may be formed by a selective epitaxial growth process in which the substrate 100 is used as a seed layer. For example, the selective epitaxial growth process may include a chemical vapor deposition (CVD) process or a molecular beam epitaxy (MBE) process.

An etching process may be first performed to selectively etch the first and second active patterns AP1 and AP2 on the opposite sides of each of the sacrificial patterns PP. Upper portions of the first and second device isolation layers ST1 and ST2 may be partially etched when the first and second active patterns AP1 and AP2 are etched. The first and second device isolation layers ST1 and ST2 below the sacrificial patterns PP may not be etched.

The etched first and second active patterns AP1 and AP2 may be used as seed layers to form the first and second source/drain patterns SD1 and SD2, respectively. A first channel CH1 may be defined between a pair of the first source/drain patterns SD1. A second channel CH2 may be defined between a pair of the second source/drain patterns SD2.

Referring to FIGS. 13 and 14A to 14C, a first interlayer dielectric layer 110 may be formed to cover the first and second source/drain patterns SD1 and SD2, the gate spacers GS, and the second mask patterns MA2. The first interlayer dielectric layer 110 may include, for example, a silicon oxide layer.

The first interlayer dielectric layer 110 may be planarized until top surfaces of the sacrificial patterns PP are exposed.

An etch-back or chemical mechanical polishing (CMP) process may be used to planarize the first interlayer dielectric layer 110. As a result, the first interlayer dielectric layer 110 may have a top surface substantially coplanar with those of the sacrificial patterns PP and those of the gate spacers GS.

The sacrificial patterns PP may be replaced with gate dielectric layers GI, gate electrodes GE, and dielectric patterns IL. For example, an anisotropic etching process may be performed on the exposed sacrificial patterns PP. The anisotropic etching process may selectively etch the sacrificial patterns PP. The dielectric patterns IL may be formed in empty spaces where the sacrificial patterns PP are removed. The gate dielectric layers GI and the gate electrodes GE may be formed in remaining empty spaces where the dielectric patterns IL are not formed.

The gate dielectric layers GI may be conformally formed by an atomic layer deposition (ALD) process or a chemical oxidation process. For example, the gate dielectric layers GI may include a high-k dielectric material. The gate electrodes GE may be formed by forming a gate electrode layer on the gate dielectric layers GI and then planarizing the gate electrode layer. The gate electrode layer may include, for example, one or more of metal and conductive metal nitride.

The gate electrodes GE may be recessed by selectively etching upper portions thereof. The recessed gate electrodes GE may have top surfaces lower than that of the first interlayer dielectric layer 110 and those of the gate spacers GS. Gate capping patterns GP may be formed on the recessed gate electrodes GE. The formation of the gate capping patterns GP may include forming a gate capping layer to cover the recessed gate electrodes GE and planarizing the gate capping layer until the top surface of the first interlayer dielectric layer 110 is exposed. For example, the gate capping layer may include one or more of SiON, SiCN, SiCON, and SiN.

Referring back to FIGS. 1 and 2A to 2C, a second interlayer dielectric layer 120 may be formed on the first interlayer dielectric layer 110, covering the gate capping patterns GP. Active contacts AC may be formed to penetrate the second and first interlayer dielectric layers 120 and 110 and to have connection with the first and second source/drain patterns SD1 and SD2. Gate contacts GC may be formed to penetrate the second interlayer dielectric layer 120 and the gate capping patterns GP and to have connection with the gate electrodes GE. The formation of the active contacts AC and the gate contacts GC may include forming holes to define areas where the active contacts AC and the gate contacts GC are formed, and forming a conductive layer to fill the holes. The conductive layer may include one or more of metal and metal nitride.

According to some example embodiments, a passivation layer may be formed on a device isolation layer. The passivation layer may prevent the device isolation layer from being excessively recessed when an etching process is performed. The passivation layer may reduce process failure and improve reliability of semiconductor devices.

Although exemplary embodiments have been discussed with reference to accompanying figures, it will be understood that various changes in form and details may be made therein without departing from the spirit and scope of the present inventive concepts. It therefore will be understood that the some example embodiments described above are just illustrative but not limitative in all aspects.

What is claimed is:

1. A semiconductor device comprising:
a substrate including a first region and a second region;
a first active pattern disposed on the first region of the substrate;
a second active pattern disposed on the first region of the substrate;
a third active pattern disposed on the second region of the substrate;
a first device isolation disposed on the substrate, and disposed between the first active pattern and the second active pattern;
a second device isolation disposed on the substrate, and disposed between the second active pattern and the third active pattern; and
a gate electrode disposed on the first active pattern, the second active pattern and the third active pattern, and disposed on the first device isolation and the second device isolation,
wherein the gate electrode includes a first portion that is disposed between the first active pattern and the second active pattern and disposed on the first device isolation, and a second portion that is disposed between the second active pattern and the third active pattern and disposed on the second device isolation,
wherein a lowermost part of the first portion of the gate electrode is disposed higher than a lowermost part of the second portion of the gate electrode, and
wherein a shortest distance between the first active pattern and the second active pattern is less than a shortest distance between the second active pattern and the third active pattern.

2. The semiconductor device of claim 1,
wherein a bottom surface of the second portion of the gate electrode has a protruding part that protrudes downwardly toward the substrate, and
wherein a bottom surface of the second device isolation has a protruding portion that protrudes downwardly toward the substrate.

3. The semiconductor device of claim 1, further comprising:
a fourth active pattern disposed on the second region of the substrate; and
a third device isolation disposed on the substrate, and disposed between the third active pattern and the fourth active pattern.

4. The semiconductor device of claim 3,
wherein the gate electrode is disposed on the fourth active pattern and on the third device isolation,
wherein the gate electrode includes a third portion that is disposed between the third active pattern and the fourth active pattern and disposed on the third device isolation,
wherein a lowermost part of the first portion of the gate electrode is disposed higher than a lowermost part of the third portion of the gate electrode, and
wherein a lowermost portion of the first device isolation is disposed higher than a lowermost portion of the second device isolation, and disposed higher than a lowermost portion of the third device isolation.

5. The semiconductor device of claim 1,
wherein the first region of the substrate is an area where a PMOS field effect transistor is disposed, and
wherein the second region of the substrate is an area where an NMOS field effect transistor is disposed.

6. The semiconductor device of claim 1,
wherein the second device isolation includes a first portion contacting the second active pattern, a second portion contacting the third active pattern, and a third portion disposed between the first portion and the second portion, wherein a depth of the third portion with respect to an uppermost portion of the second device isolation is greater than a depth of the first portion with respect to the uppermost portion of the second device isolation, and greater than a depth of the second portion with respect to the uppermost portion of the second device isolation, and wherein a first protruding pattern that protrudes upwardly from a bottom surface of the second device isolation is disposed between the first portion of the second device isolation and the third portion of the second device isolation.

7. The semiconductor device of claim 6, wherein a second protruding pattern that protrudes upwardly from the bottom surface of the second device isolation is disposed between the second portion of the second device isolation and the third portion of the second device isolation.

8. The semiconductor device of claim 1, further comprising:
a first source/drain disposed on the first active pattern;
a second source/drain disposed on the second active pattern and contacting the first source/drain; and
a third source/drain disposed on the third active pattern.

9. A semiconductor device comprising:
a substrate including a first region and a second region;
a first active pattern disposed on the first region of the substrate;
a second active pattern disposed on the first region of the substrate;
a third active pattern disposed on the second region of the substrate;
a first device isolation disposed on the substrate, and disposed between the first active pattern and the second active pattern;
a second device isolation disposed on the substrate, and disposed between the second active pattern and the third active pattern; and
a gate electrode disposed on the first active pattern, the second active pattern and the third active pattern, and disposed on the first device isolation and the second device isolation,
wherein the gate electrode includes a first portion that is disposed between the first active pattern and the second active pattern and disposed on the first device isolation, and a second portion that is disposed between the second active pattern and the third active pattern and disposed on the second device isolation,
wherein a shortest distance between the first active pattern and the second active pattern is less than a shortest distance between the second active pattern and the third active pattern,
wherein a bottom surface of the second portion of the gate electrode has a protruding part that protrudes downwardly toward the substrate, and
wherein a bottom surface of the second device isolation has a protruding portion that protrudes downwardly toward the substrate.

10. The semiconductor device of claim 9, wherein a lowermost part of the first portion of the gate electrode is disposed higher than a lowermost part of the second portion of the gate electrode.

11. The semiconductor device of claim 9, further comprising:
a fourth active pattern disposed on the second region of the substrate; and
a third device isolation disposed on the substrate, and disposed between the third active pattern and the fourth active pattern,
wherein the gate electrode is disposed on the fourth active pattern and on the third device isolation,
wherein the gate electrode includes a third portion that is disposed between the third active pattern and the fourth active pattern and disposed on the third device isolation,
wherein a lowermost part of the first portion of the gate electrode is disposed higher than a lowermost part of the third portion of the gate electrode, and
wherein a lowermost portion of the first device isolation is disposed higher than a lowermost portion of the second device isolation, and disposed higher than a lowermost portion of the third device isolation.

12. The semiconductor device of claim 11,
wherein the shortest distance between the first active pattern and the second active pattern is less than a shortest distance between the third active pattern and the fourth active pattern, and
wherein the shortest distance between the second active pattern and the third active pattern is substantially equal to the distance between the third active pattern and the fourth active pattern.

13. The semiconductor device of claim 9, wherein the first region of the substrate is a logic cell region, and the second region of the substrate is a memory cell region.

14. A semiconductor device comprising:
a substrate including a first region and a second region;
a first active pattern disposed on the first region of the substrate;
a second active pattern disposed on the first region of the substrate;
a third active pattern disposed on the second region of the substrate;
a fourth active pattern disposed on the second region of the substrate;
a first device isolation disposed on the substrate, and disposed between the first active pattern and the second active pattern;
a second device isolation disposed on the substrate, and disposed between the second active pattern and the third active pattern;
a third device isolation disposed on the substrate, and disposed between the third active pattern and the fourth active pattern; and
a gate electrode disposed on the first active pattern, the second active pattern, the third active pattern and the fourth active pattern, and disposed on the first device isolation, the second device isolation and the third device isolation,
wherein the gate electrode includes a first portion that is disposed between the first active pattern and the second active pattern and disposed on the first device isolation, a second portion that is disposed between the second active pattern and the third active pattern and disposed on the second device isolation, and a third portion that is disposed between the third active pattern and the fourth active pattern and disposed on the third device isolation,
wherein a lowermost part of the first portion of the gate electrode is disposed higher than a lowermost part of the second portion of the gate electrode, and disposed higher than a lowermost part of the third portion of the gate electrode, and wherein a lowermost portion of the first device isolation is disposed higher than a lowermost portion of the second device isolation, and disposed higher than a lowermost portion of the third device isolation.

15. The semiconductor device of claim 14, wherein the first device isolation is disposed on the first region of the substrate, wherein the second device isolation is disposed on the first region and the second region of the substrate, and wherein the third device isolation is disposed on the second region of the substrate.

16. The semiconductor device of claim 14, wherein the second device isolation includes a first portion contacting the second active pattern, a second portion contacting the third active pattern, and a third portion disposed between the first portion and the second portion, wherein a depth of the third portion with respect to an uppermost portion of the second device isolation is greater than a depth of the first portion with respect to the uppermost portion of the second device isolation, and greater than a depth of the second portion with respect to the uppermost portion of the second device isolation, and wherein a protruding pattern that protrudes upwardly from a bottom surface of the second device isolation is disposed between the first portion of the second device isolation and the third portion of the second device isolation.

17. The semiconductor device of claim 16, further comprising:

a first passivation layer disposed on the first device isolation;

a second passivation layer disposed on the second device isolation and including a first portion disposed on the first portion of the second device isolation, a second portion disposed on the second portion of the second device isolation and a third portion disposed on the third portion of the second device isolation; and a third passivation layer disposed on the third device isolation, wherein a bottom surface of the first portion of the second passivation layer is disposed higher than a bottom surface of the third portion of the second passivation layer, and wherein a bottom surface of the second portion of the second passivation layer is disposed higher than the bottom surface of the third portion of the second passivation layer.

18. The semiconductor device of claim 17, further comprising a gate dielectric layer disposed between the gate electrode and the first, second, third and fourth active patterns, and between the gate electrode and the first, second and third passivation layers.

19. The semiconductor device of claim 14, wherein a shortest distance between the first active pattern and the second active pattern is less than a shortest distance between the second active pattern and the third active pattern, and wherein the shortest distance between the second active pattern and the third active pattern is substantially equal to a shortest distance between the third active pattern and the fourth active pattern.

20. The semiconductor device of claim 14, wherein a bottom surface of the second portion of the gate electrode has a protruding part that protrudes downwardly toward the substrate, and wherein a bottom surface of the second device isolation has a protruding portion that protrudes downwardly toward the substrate.

* * * * *